United States Patent [19]
Luna

[11] Patent Number: 6,047,469
[45] Date of Patent: Apr. 11, 2000

[54] METHOD OF CONNECTING A UNIT UNDER TEST IN A WIRELESS TEST FIXTURE

[75] Inventor: L. Jack Luna, Port Hueneme, Calif.

[73] Assignee: Luna Family Trust, Oxnard, Calif.

[21] Appl. No.: 08/968,960

[22] Filed: Nov. 12, 1997

[51] Int. Cl.⁷ .................................................. H05K 3/36
[52] U.S. Cl. ............................. 29/830; 29/852; 324/754
[58] Field of Search ........................... 29/825, 830, 833, 29/593; 324/754

[56] References Cited

U.S. PATENT DOCUMENTS

| | | |
|---|---|---|
| 4,758,780 | 7/1988 | Coon et al. . |
| 4,899,106 | 2/1990 | Ogura . |
| 5,216,361 | 6/1993 | Akar et al. . |
| 5,225,771 | 7/1993 | Leedy . |
| 5,491,427 | 2/1996 | Ueno et al. . |
| 5,502,397 | 3/1996 | Buchanan . |
| 5,574,382 | 11/1996 | Kimura . |
| 5,706,578 | 1/1998 | Hüber ........................................ 29/830 |
| 5,736,679 | 4/1998 | Kresge et al. ........................ 29/830 X |
| 5,906,042 | 5/1999 | Lan et al. ............................. 29/830 X |

FOREIGN PATENT DOCUMENTS 2742534  3/1979  Germany .................................. 29/830

*Primary Examiner*—Carl J. Arbes
*Attorney, Agent, or Firm*—Brown, Martin, Haller & McClain, LLP

[57] ABSTRACT

A multilayer printed circuit board has prefabricated inner signal layers and unfinished top and bottom layers for customizing the board for a particular test installation. Each signal layer has a predetermined arrangement of circuits, each circuit having first and second via pads at opposite ends of the circuit. The first via pads form a virtual grid for selective connection to test points of a unit under test. The top layer is processed to provide a test pad aligned with each test point on a unit under test, a via pad for each test pad which is aligned with the closest available virtual grid via, and a connecting trace between each test pad and the associated via pad. Plated through holes are drilled through the board at each outer layer via pad for connection to the aligned virtual grid via. Similar processing of the bottom layer connects the via pad at the opposite end of each assigned inner layer circuit to an interface pad for connection to a respective terminal of automated test equipment.

4 Claims, 23 Drawing Sheets

6,047,469

METHOD OF CONNECTING A UNIT UNDER TEST IN A WIRELESS TEST FIXTURE

BACKGROUND OF THE INVENTION

The present invention relates generally to the testing of electronic circuit boards or subassemblies, and is particularly concerned with a multilayer printed circuit board or translator board for connecting test points on a unit or circuit board under test to the testing electronics of automatic test equipment, and to a method of manufacturing such a board.

The electronics manufacturing industry has a continuing need for production testing of electronic subassemblies. Automatic test equipment (ATE) is typically used to test the components and circuit interconnections on printed circuit boards after assembly, to determine whether any of the components are defective and whether there are any manufacturing defects such as short circuits, open circuits, or incorrectly installed components. The ATE comprises a large, computer based system and is expensive to purchase and to support and maintain. Testing costs are a significant portion of production costs in the electronics industry.

Most ATE systems are general purpose and can be used to test a variety of different electronic products. However, for each electronic product to be tested, a unique or one-of-a-kind test fixture must be provided to electronically interconnect the test object, called a unit under test (UUT), with the ATE test set electronics. Additionally, a unique, one-of-a-kind test program must be created to describe the UUT components and circuitry and the interconnections to the ATE computer.

Text fixtures are rectangular shaped, box-like assemblies that include what is called a "bed of nails" or spring probes on top of the assembly for contacting test points on a UUT, and an ATE interface panel on the bottom for connection with the ATE test set electronics. Additionally, some means is provided for electronically interconnecting the spring probes to the interface panel according to the specific testing requirements. In wired test fixtures, insulated wires are used to provide the required interconnections. Because several hundred, and sometimes thousands, of interconnections are required in the test fixture, wiring is a very labor intensive and error prone process. The large number of wires also degrades test signals and limits the speed at which components can be tested. Long wire lengths also result in test signal degradation and cause undesirable "cross-talk" or noise that can result in unstable or erroneous test results.

Wireless test fixtures are technically superior to wired test fixtures but more expensive to produce. In this case, the required interconnections are provided in a multi-layer printed circuit board (PCB). Double ended spring probes contact the UUT at one end, and contact plated pads on top of the printed circuit board or interface board at the other end. The bottom layer of the PCB has plated pads which interface with the ATE terminals.

Interconnections between the top pads and bottom pads are provided by predetermined printed wiring on the various layers of the PCB. The printed wiring is considerably shorter in length and less susceptible to noise and cross-talk than the wires used in wired test fixtures. Wireless test fixtures are technically superior to wired test fixtures but are more expensive and also more time consuming in design and fabrication, since a one-of-a-kind PCB must be designed and fabricated for each new circuit board to be tested.

Because of the requirement of a unique test fixture for each different electronic product, one or more new test fixtures are required for production support each time a new electronic product is designed. Such test fixtures are expensive and time consuming to design and manufacture. This requirement is the most common cause of delay in marketing new electronic products.

U.S. Pat. No. 5,216,361 of Akar et al. describes a circuit board test system with a wireless test fixture or receiver for providing the necessary connection between an ATE system and UUT. In this case, a PCB or translation board defines a prescribed signal mapping for interconnecting I/O pins of ATE pin cards to the underside of a fixture to be tested. A different translation board with a different mapping is required for different units to be tested.

Currently, as noted above, a completely new PCB or interconnecting panel must be designed and fabricated each time a new electronic product is designed. The design and fabrication of such PCBs currently takes two to three weeks, considerably delaying the introduction of new electronic products.

SUMMARY OF THE INVENTION

It is an object of the present invention to provide a new and improved interconnection board and method for providing the necessary interconnections between automatic test equipment and a unit under test.

According to one aspect of the present invention, a multi-layer interconnection or translation board for use in connecting any one of a plurality of different units under test to automated test equipment is provided, which comprises a plurality of stacked internal signal layers and power and ground layers, each signal layer having a predetermined arrangement of spaced sets of conductive traces, each conductive trace having a first via pad at one end and a second via pad at the opposite end, each power and ground layer having a predetermined arrangement of busses, the first via pad arrangement on the signal layers being such that the first via pads in all layers together define a grid of virtual vias for selective assignment to test points of a unit under test, and first and second outer layers secured at opposite ends of the stack of internal layers, the outer layers having no prefabricated circuits.

The first contact pads at one end of each circuit on the inner layers of the board form a virtual grid of vias for selective assignment to test points on a circuit to be tested. Since there is originally no connection between the virtual grid vias and the outer layers of the board, they may be described as "virtual". The inner signal layers together define a virtual grid of potential contact points for connection of a pad placed on one outer layer to an offset pad on the other outer layer. When the interconnection board is required for making interconnections between a specific unit under test (UUT) and automatic testing equipment, the two outer layers are customized to connect the required test points on the UUT to test pins on the ATE test set. Therefore, rather than requiring a completely new multi-layer circuit board for each new electronic product to be tested, only the outer two layers of a prefabricated multi-layer board need to be customized to the particular application, as opposed to customizing all the layers as was necessary in the past. This considerably reduces the cost and time required in producing a wireless test fixture.

The outer two layers of the interconnection board are processed in a similar manner as a double sided PCB. Pads will be deposited on the first or upper layer to correspond with the desired geometry of the test object, and each pad will be assigned to the nearest virtual via pad in the virtual array or grid. Another via pad is then deposited on the upper layer in alignment with the selected via pad, and the two upper layer pads are connected by a conductive trace. The upper layer via pad is connected to the inner layer via pad by means of a drilled and plated through hole. The inner layer via pad will be connected to an offset via pad in the same layer, and the offset via pad is connected to an aligned via pad on the second or bottom outer layer in a similar manner. The via pad on the bottom layer is connected by a circuit trace to an ATE connector pad.

The interface panel or printed circuit board of this invention therefore requires custom processing of the top and bottom layers only, with the inner layers all being pre-fabricated and usable with a large number of different test configurations by suitable processing of the outer layers and drilling of plated through holes to make the desired connections from a contact pad on one outer layer to an offset contact pad on the other outer layer. Thus, since the majority of the printed circuit board can be pre-fabricated, the time and cost involved in producing a suitable interface board for each new unit to be tested is considerably reduced.

According to another aspect of the present invention, a method of connecting a unit under test having a plurality of test points to automated test equipment is provided, which comprises the steps of providing a multilayer printed circuit board for providing interconnections between test points on the unit under test and pre-selected terminals of automated test equipment, the printed circuit board having a plurality of stacked internal signal layers and power and ground layers, each signal layer having a predetermined arrangement of spaced contact pads and interconnecting conductive traces, with the pad at one end of each conductive trace forming part of a virtual grid of vias for selective connection to test points of a unit under test, each power and ground layer having a predetermined arrangement of busses, and first and second outer layers secured at opposite ends of the stack of internal layers, processing the first outer layer to provide a test pad aligned with each test point on the unit under test, a via pad for each test pad which is aligned with the closest available inner layer via of the virtual grid, and a connecting trace between each test pad and the associated via pad, drilling a plated through hole through the board at each outer layer contact pad to connect the outer layer via pad with the aligned aligned virtual grid via, whereby at least a plurality of test pads is connected to predetermined virtual grid vias, processing the second outer layer to provide a via pad aligned with each inner layer contact pad at the opposite end of each conductive trace to a virtual grid via, drilling a plated through hole through each outer layer via pad to connect the second outer layer via pads with respective inner layer contact pads, providing a series of interface contact pads on the outer layer for connection to respective automated test equipment terminals, and connecting each interface contact pad with a respective second outer layer via pad with a conductive trace.

With this method, all the internal layers of the printed circuit board are pre-fabricated and the outer layers only are processed to provide the required pads and traces for a specific test installation and unit under test. Computer software may be used for assigning each test pad on the upper layer with the closest available virtual grid via and for connecting the interface contact pads on the lower layer with the appropriate via pads. This method is significantly less expensive and time consuming than the previous technique where a completely new printed circuit board was required for each new unit to be tested.

BRIEF DESCRIPTION OF THE DRAWINGS

The present invention will be better understood from the following detailed description of a preferred embodiment of the invention, taken in conjunction with the accompanying drawings, in which like reference numerals refer to like parts, and in which.

DESCRIPTION OF THE PREFERRED EMBODIMENT

Figure 1:
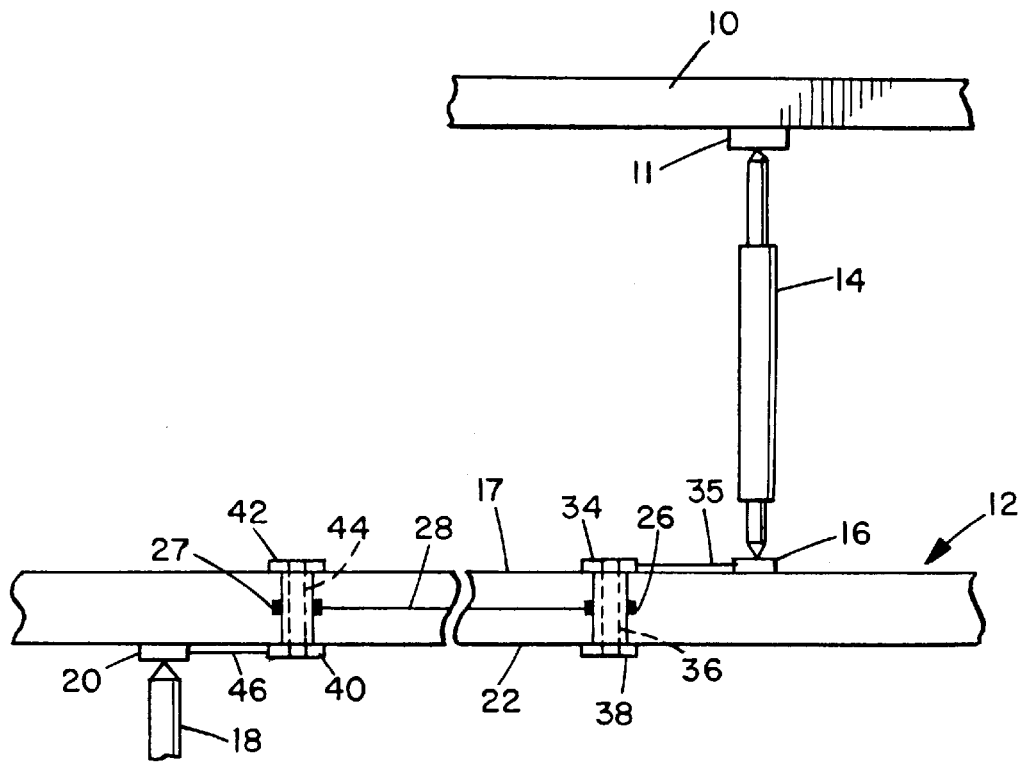
FIG. 1 is a schematic side elevational view of a wireless test fixture incorporating a multi-layer interconnection board according to a preferred embodiment of the present invention for connecting a unit under test to automated testing equipment.

FIG. 1 of the drawings illustrates a test fixture for testing an electronic product, or unit under test (UUT) 10 using automated testing equipment (ATE). Each test point 11 on the UUT 10 is linked to a corresponding terminal on the ATE via an interconnection board or multilayer printed circuit board 12 according to a preferred embodiment of the present invention, which is described in more detail below in connection with FIGS. 2 to 25. A first spring probe 14 provides electrical connection between a test point 11 on the UUT 10 and a test pad 16 on a first or upper outer layer 17 of the board 12, while a second spring probe 18 provides electrical connection between an interface pad 20 on the second or lower outer layer 22 of the board and a terminal on the ATE.

Figure 2:
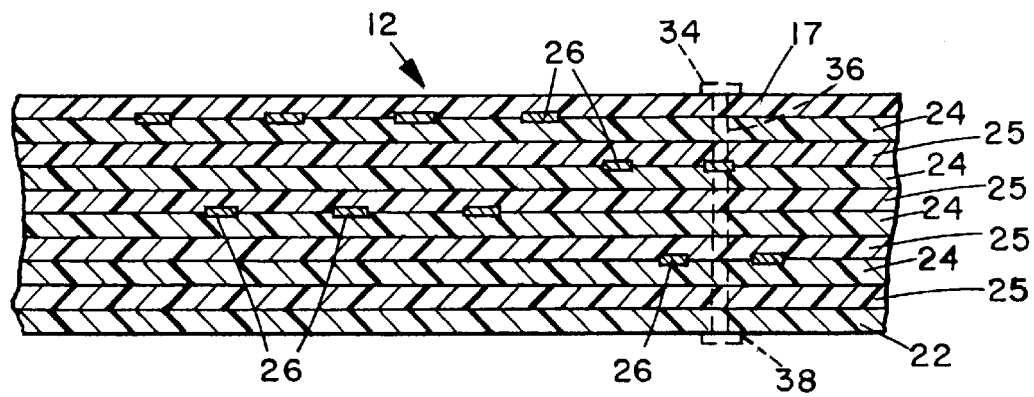
FIG. 2 is a partial vertical cross section through the interconnection board of FIG. 1.

As best illustrated in FIG. 2, the multilayer printed circuit board or interface board according to a preferred embodiment of the present invention comprises a number of very thin panels or layers. The layers include the two outer layers 17,20, a plurality of inner signal layers 24, and a plurality of inner power/ground layers 25. The actual number of inner signal layers may vary dependent on the types of testing being done, and boards may be provided with a greater or lesser number of inner layers as desired.

Figure 9:
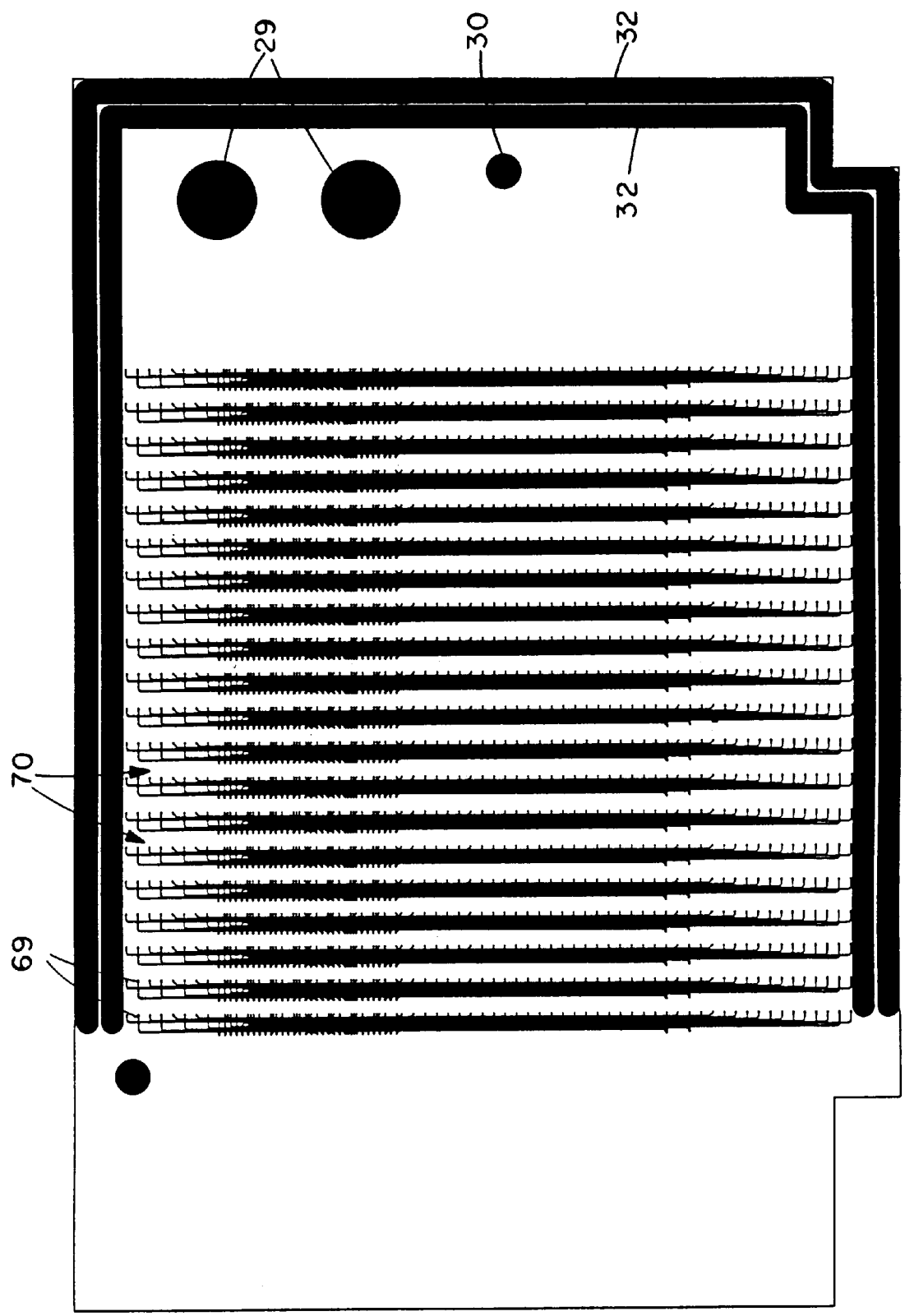
FIG. 9 is a top plan view illustrating a composite of all four inner signal layers.
Figure 10:
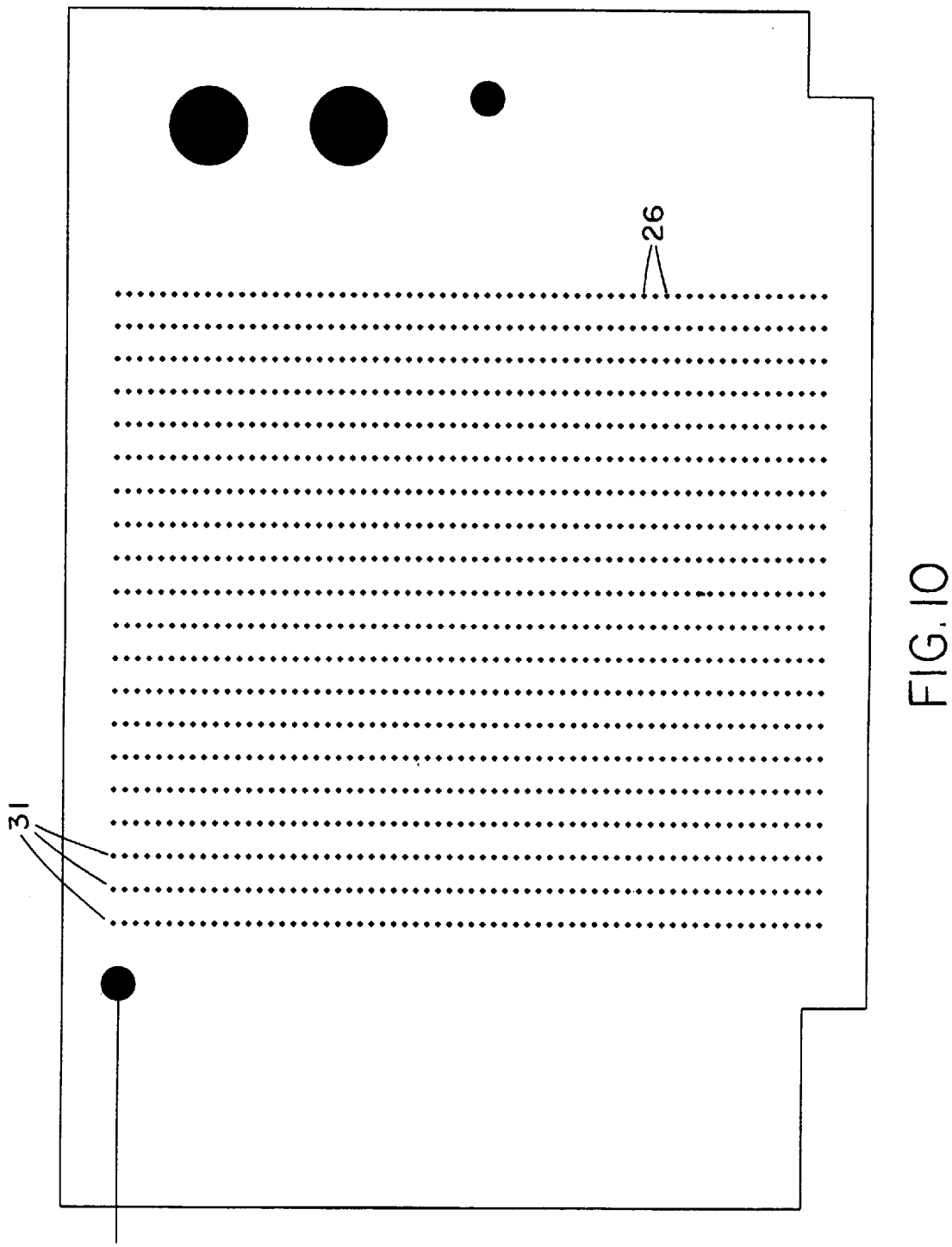
FIG. 10 is a view similar to FIG. 9 but eliminating all inner layer circuits and the via pads at one end of each circuit, so as to illustrate the grid of virtual via pads produced by the composite signal layers.

Each panel or layer of the board 12 comprises an electrically insulated core material that has copper deposited on one side. Through photographic and/or chemical processes, copper is removed from the side of the panel to form predetermined pads and traces to conduct electrical currents from one point to another point of the panel or layer. FIGS. 5 to 9 illustrate four signal layers in one example of a board 12 according to a preferred embodiment of the invention. Each inner signal layer is provided with a plurality of circuits or conductive traces 28, each of which has a first via pad 26 at one end and a second via pad 27 at the opposite end. All via pads 26,27 in one layer are offset from all the via pads in the other three layers. When all four signal layers are superimposed, the first via pads 26 form a rectangular grid pattern or array of via pads, as best illustrated in FIG. 10. The grid has a series of spaced columns 31 each containing a plurality of spaced via pads 26. The signal layers create a grid of via pads which is of predetermined dimensions, depending on the dimensions of the circuit board or UUT 10. In one example of the invention, the grid of FIG. 11 had dimensions of the order of 12" by 12.8", and had 20 columns with 64 grid points per column, providing 1280 grid points or first via pads 26 for connection to test points on a circuit to be tested.

In addition to the via pads and connecting traces, each signal layer also has vacuum inlets 29 aligned with the vacuum inlets in the other layers, tooling pin openings 30, and a pair of conductive bands 32 extending around three sides of its outer periphery. Each of the signal layers is pre-fabricated, as are the power/ground layers, which are described in more detail below in connection with FIGS. 16 to 25. The power/ground layers create a power and ground plane matrix or grid for the ATE power supplies.

The outer layers 17 and 22 of board 12 are initially copper clad, unfinished layers. After the signal and power/ground layers have been suitably fabricated, all the layers are laminated and glued together, along with the unfinished outer layers, using known printed circuit board lamination techniques. The outer layers only are then customized for the particular unit under test and testing equipment used. Thus, unlike prior art interface boards where all of the layers were custom fabricated for each new electronic product to be tested, the interface board of this invention has all of the inner layers completely pre-fabricated, and only the outer two layers must be processed according to the particular unit to be tested.

Figure 3:
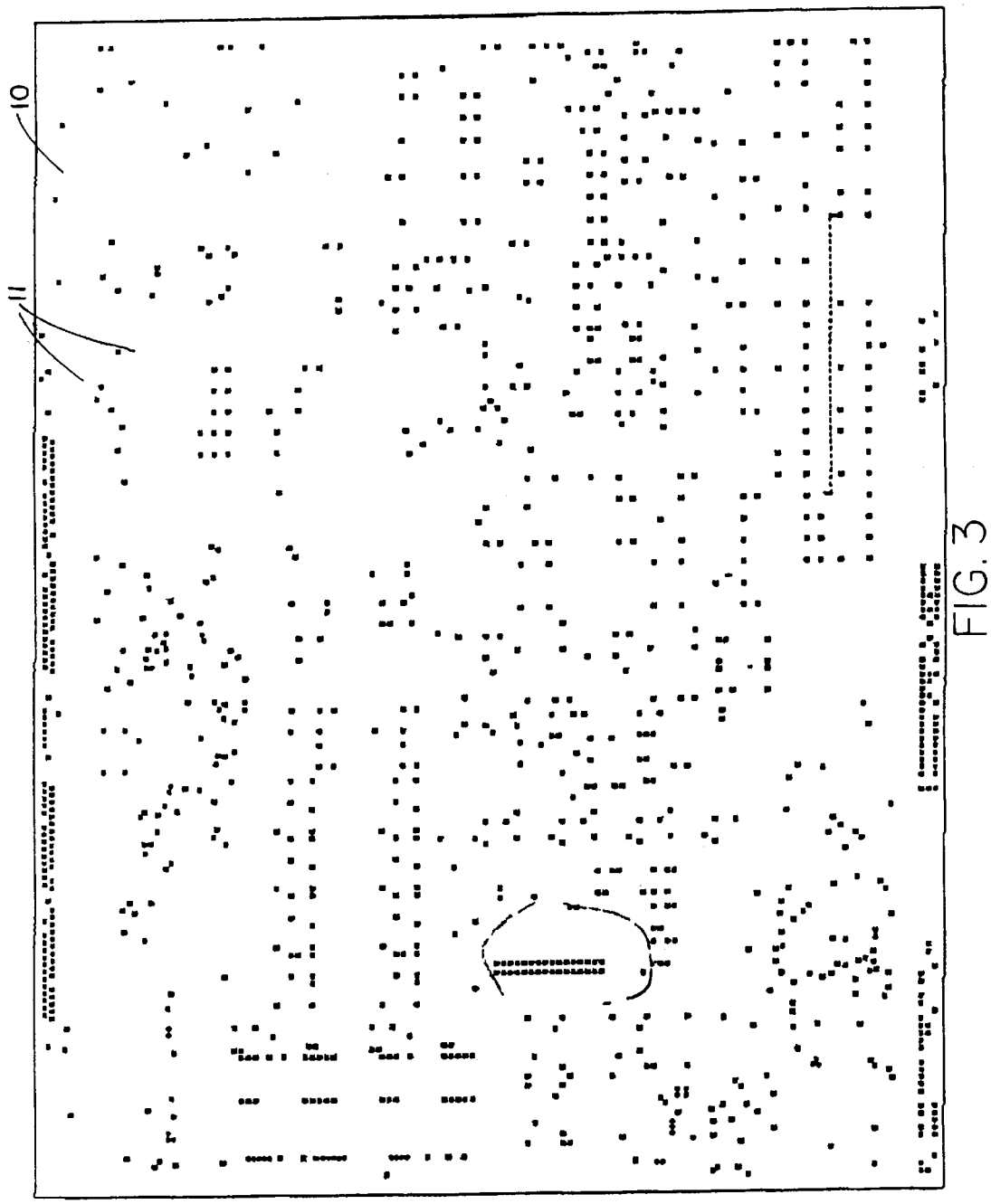
FIG. 3 is an exemplary view of a typical arrangement of test points on a unit under test (UUT)

The procedure for processing the two outer layers will now be described in more detail. Each electronic product to be tested will typically have a circuit board with a random array of test points on a UUT. FIG. 3 illustrates one possible example of a board or UUT 10 with an array of test points 11. Typically there are a large number of test points which must be simultaneously connected to the ATE. In this example, the UUT 10 has 1110 test points, although a greater or lesser number of test points may be present in other units to be tested. Since the virtual grid has 1280 grid points for potential connection to UUT test points, it should normally be possible for all test points to be assigned to virtual grid points or pads 26.

Figure 4:
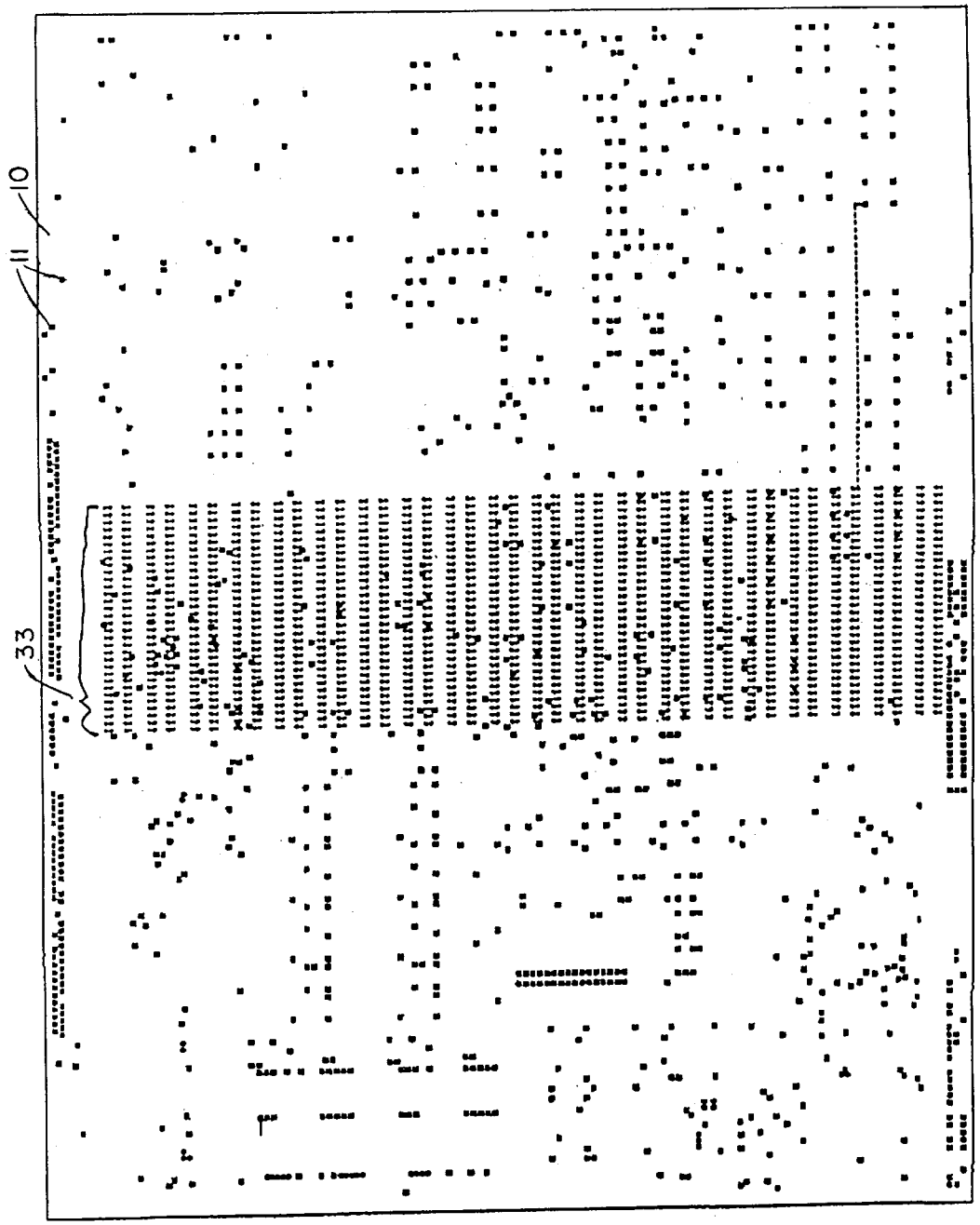
FIG. 4 illustrates the test points of the unit under test superimposed on typical terminals of automated testing equipment (ATE)
Figure 5:
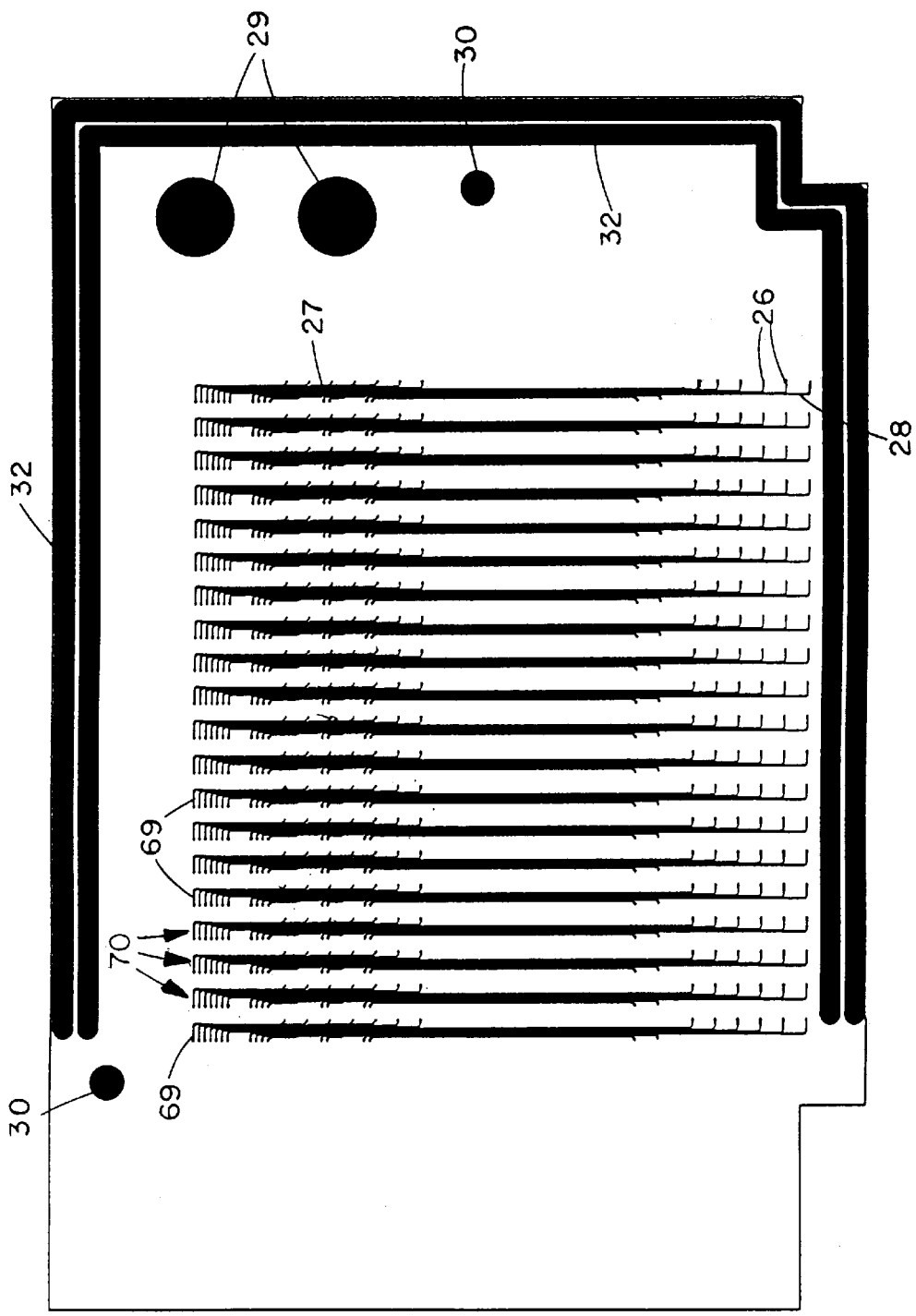
FIG. 5 is a top plan view of a first inner signal layer in the interconnection board of FIGS. 1 and 2.
Figure 6:
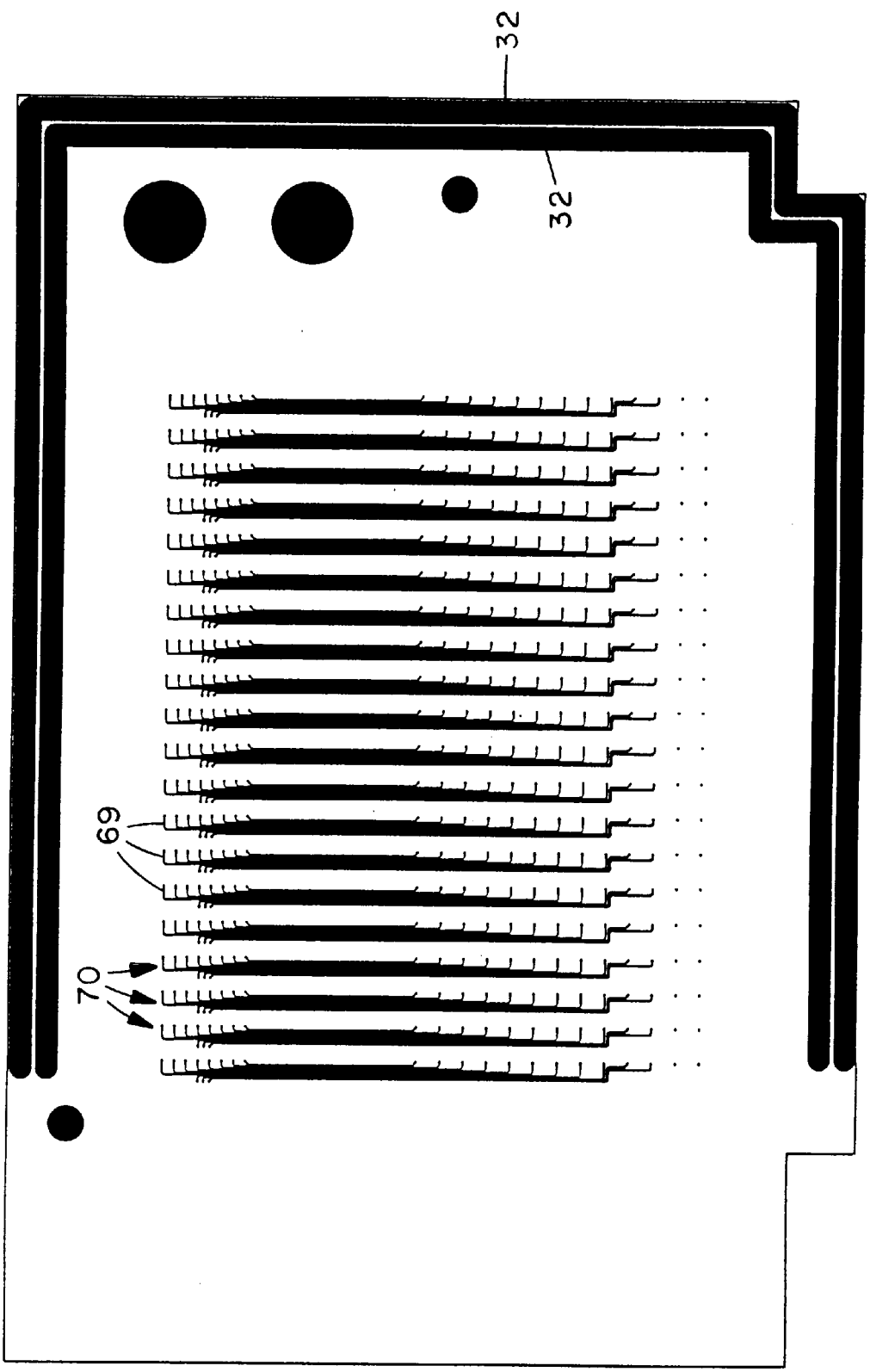
FIG. 6 is a top plan view of a second inner signal layer in the interconnection board of FIGS. 1 and 2.

FIG. 4 illustrates the test points of FIG. 3 superimposed on a typical array of ATE interface points or terminals 33. Each of the test points 11 must be connected to a selected one of the terminals 33, and this is achieved by appropriate placing of pads and circuits on the outer layers 17,22 of the board 12, and by circuit routing through the inner layers of board 12.

Figure 11:
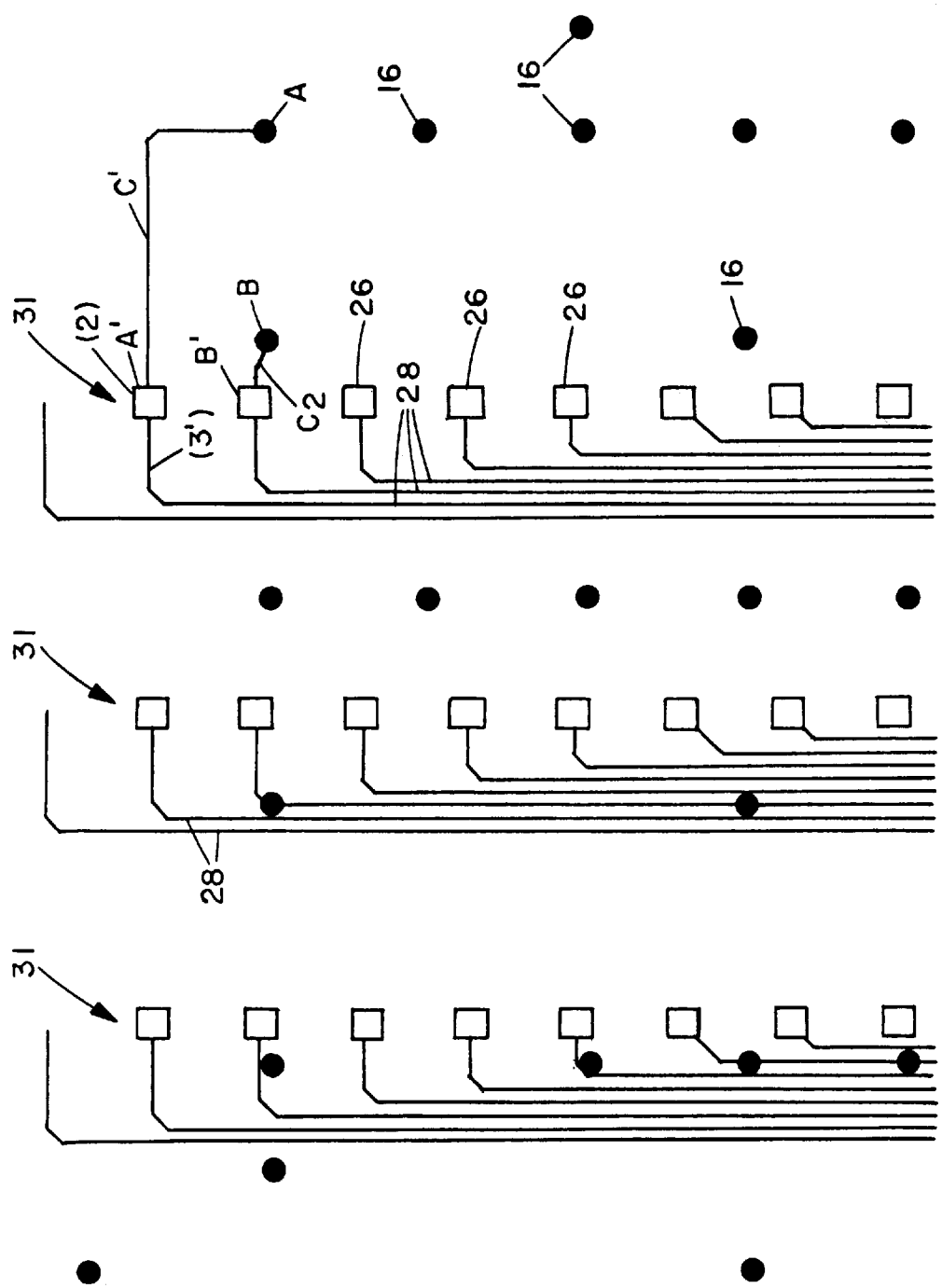
FIG. 11 is an enlargement of a portion of one of the inner signal layers with a portion of the upper layer superimposed on the inner layer to illustrate the individual circuit paths from a test pad on the upper layer to a via pad in the inner layer.

Prior to processing of the outer layers, the via pads 26,27 on each inner layer are isolated and not connected to any other via pads in other layers of the board. They are therefore virtual via pads prior to final fabrication of the board, and the grid of FIG. 11 is a virtual grid until final processing of the board. The interface board 12 may therefore be referred to as a virtual grid panel after initial fabrication and up to final processing for a particular test installation.

The outer layers are fabricated as follows. A test pad 16 is positioned on the outer layer in alignment with each of the test points 11 on the particular unit under test. Thus, a plurality of test pads 16 will be randomly positioned on the upper layer 17 as dictated by the location of test points 11 on the circuit board to be tested. Each test pad 16 is assigned to the closest available first via pad 26 in the grid of FIG. 11. A via pad 34 is then placed on the outer layer in alignment with the selected grid via pad 26, as best illustrated in FIG. 1, and pad 16 is connected to via pad 34 by a conductive trace 35. This process is repeated until all test pads 16 have been assigned to a grid pad, and connected to via pads 34 as appropriate, assuming that sufficient grid pads are available. The case where there are insufficient available virtual via pads in the grid will be described later in more detail. In this simplified case, it is assumed that there are sufficient available virtual via pads to provide the necessary circuits.

As noted above, via pad 34 is aligned with an underlying virtual via pad 26 in one of the inner signal layers 24. In order to connect via pad 34 to virtual via pad 26, a plated through hole 36 must be formed. First, a pad 38 is placed on the bottom layer 22 in alignment with pad 34, and then a hole is drilled through the pads 34,26 and 38. A conductive layer is deposited around the inner wall of the through hole 36, according to through hole plating techniques which are well known in the printed circuit board field. This connects the pad 32 to the inner layer via pad 26.

The via pad 27 at the other end of the conductive trace 28 in the inner signal layer must then be connected to the lower layer 22 of the board. A via pad 40 is placed on the lower layer 22 in alignment with the second via pad 27 in FIG. 1, and an aligned via pad 42 is placed on the upper layer 17. A plated through hole 44 is then drilled through pads 40,27,42 to connect the second internal via pad to lower layer 22. The via pad 40 on the lower layer is connected to an interface pad 20 aligned with a respective test terminal on the ATE via conductive trace 46. It will be understood that this process is repeated so as to connect each test point 11 to a respective ATE terminal via spring probe 18. The spring probes 18 are mounted in the ATE and connected to the test set electronics in the conventional manner.

With this arrangement, all of the inner layer circuitry of an interface panel or multi-layer printed circuit board is pre-fabricated to provide a virtual grid panel which can be customized to provide an interface between a wide range of different electronic products or units and testing equipment for the units. The required circuitry for each installation is only effected when the pads and circuits are placed on the outer layers and the plated through holes are drilled. However, since 90% of the circuitry is contained in the prefabricated inner layers, the time taken to design and route a virtual grid panel for a particular test installation can be as little as a few minutes, when conventional auto-routing software is used to design the outer layers and through hole positions. The use of fixed, pre-fabricated inner layer circuits considerably simplifies the auto-routing process. In conventional interface boards, where each layer must be custom designed for a particular installation, designing and circuit routing can take many hours or even days to complete.

As noted above, FIGS. 5 to 8 illustrate one example of a set of four inner signal layers for producing a virtual via grid as illustrated in FIG. 10. FIG. 9 illustrates the four signal layers superimposed including all via pads 26,27 and conductive traces 28. It can be seen that, in each signal layer, the circuits and pads are arranged in a set of spaced columns or strips 69, with gaps 70 between adjacent strips, and the circuit strips in all four layers are aligned, as indicated in FIG. 9. In FIG. 10, the second via pads 27 and conductive traces 28 have been removed so as to illustrate the virtual grid or array of via pads 26 available for assignment to test points.

Figure 7:
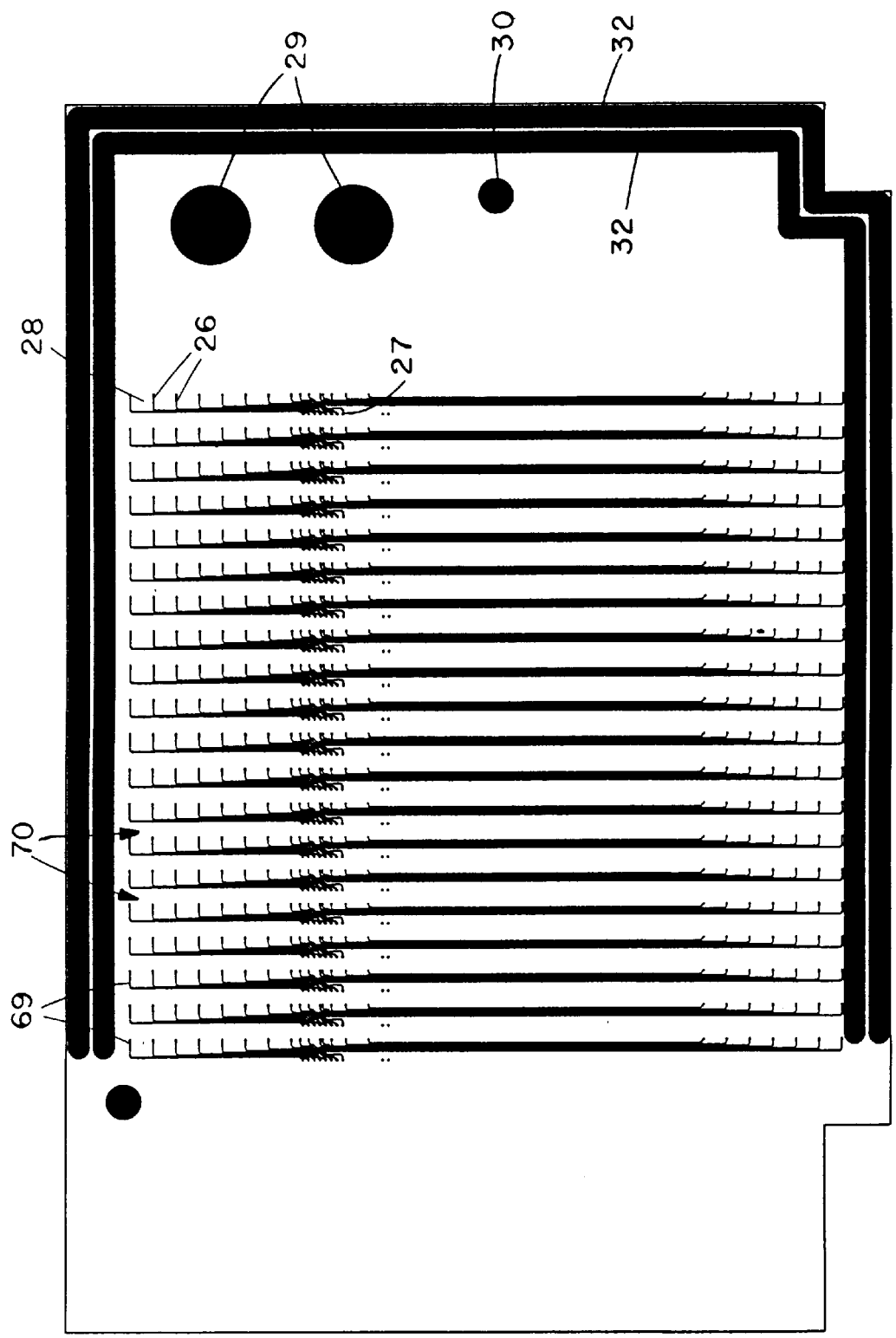
FIG. 7 is a top plan view of a third inner signal layer in the interconnection board of FIGS. 1 and 2.
Figure 8:
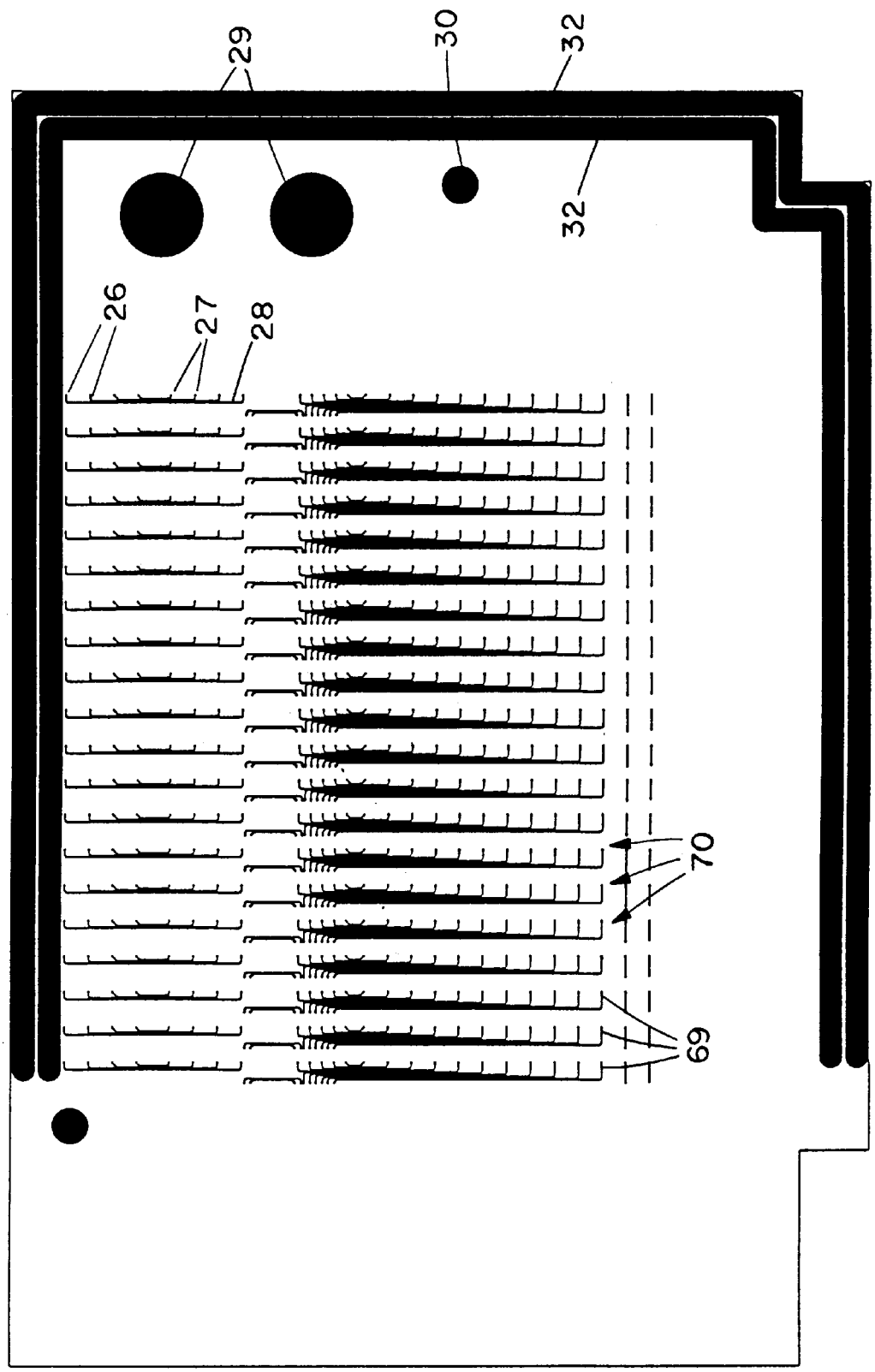
FIG. 8 is a top plan view of a fourth inner signal layer in the interconnection board of FIGS. 1 and 2.

FIG. 11 is an enlargement of part of the third inner signal layer of FIG. 7, illustrating some of the first via pads 26 of the virtual grid, along with the associated conductive traces 28. In this enlargement, it can be seen that each of the conductive traces is separate and isolated from the adjacent, parallel traces. Test pads 16 on part of the upper layer have been superimposed on the pads and traces of FIG. 11 to indicate how the assignment of test pads to via pads in the inner layers is achieved. As illustrated in FIG. 11, a first test pad A in the upper layer is assigned to the uppermost pad A' of the via pads 26 in one column 31 of the third inner layer, and a top layer circuit or conductive trace $C_1$ connects pad A to an upper layer pad which is aligned with via pad A'. A second test pad B is assigned to the next pad B' in the column, and an upper layer circuit trace $C_2$ connects pad B to an upper layer pad which is aligned with via pad B'.

Figure 12:
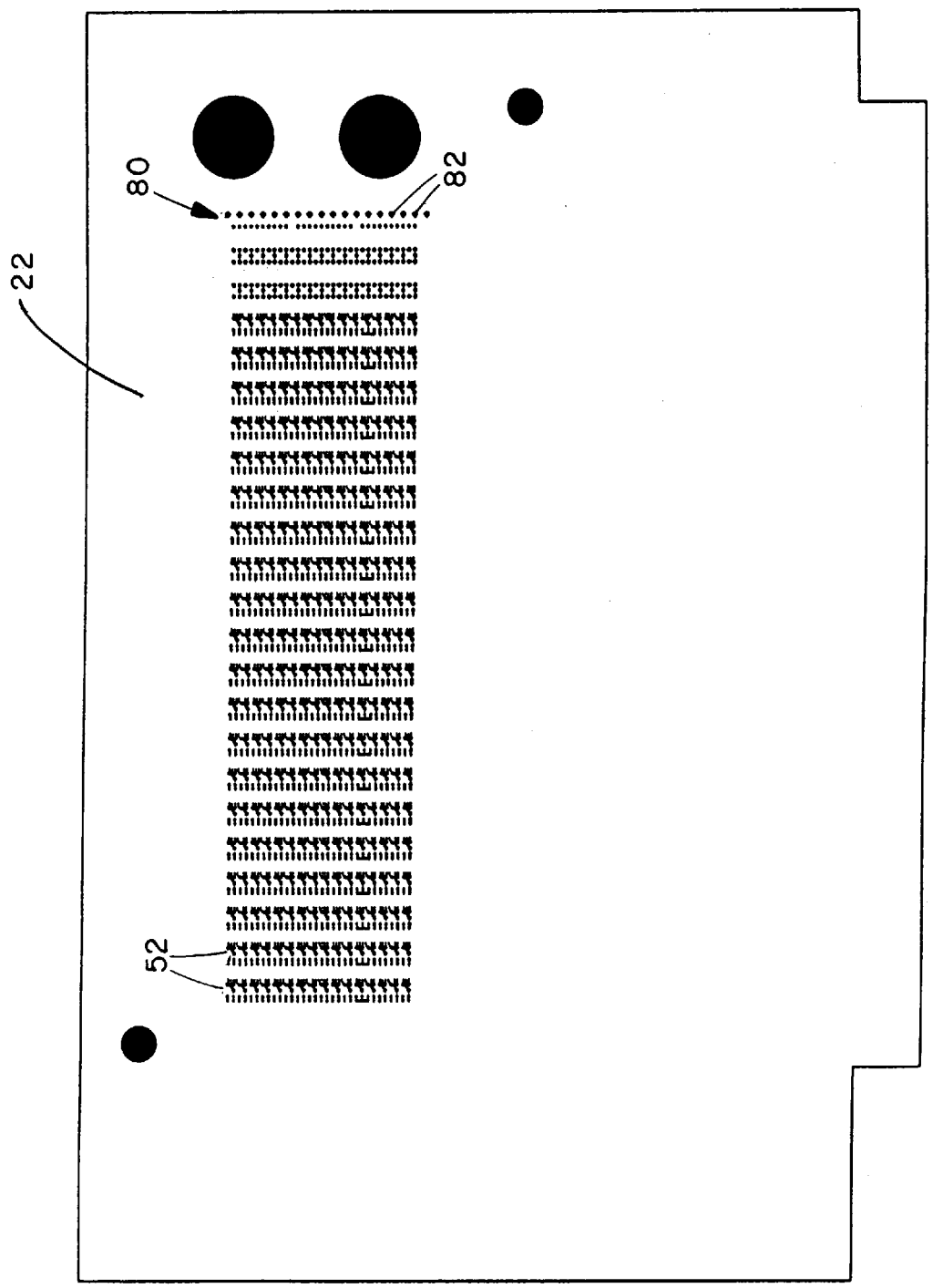
FIG. 12 is a plan view of the bottom layer pads and circuits.
Figure 13:
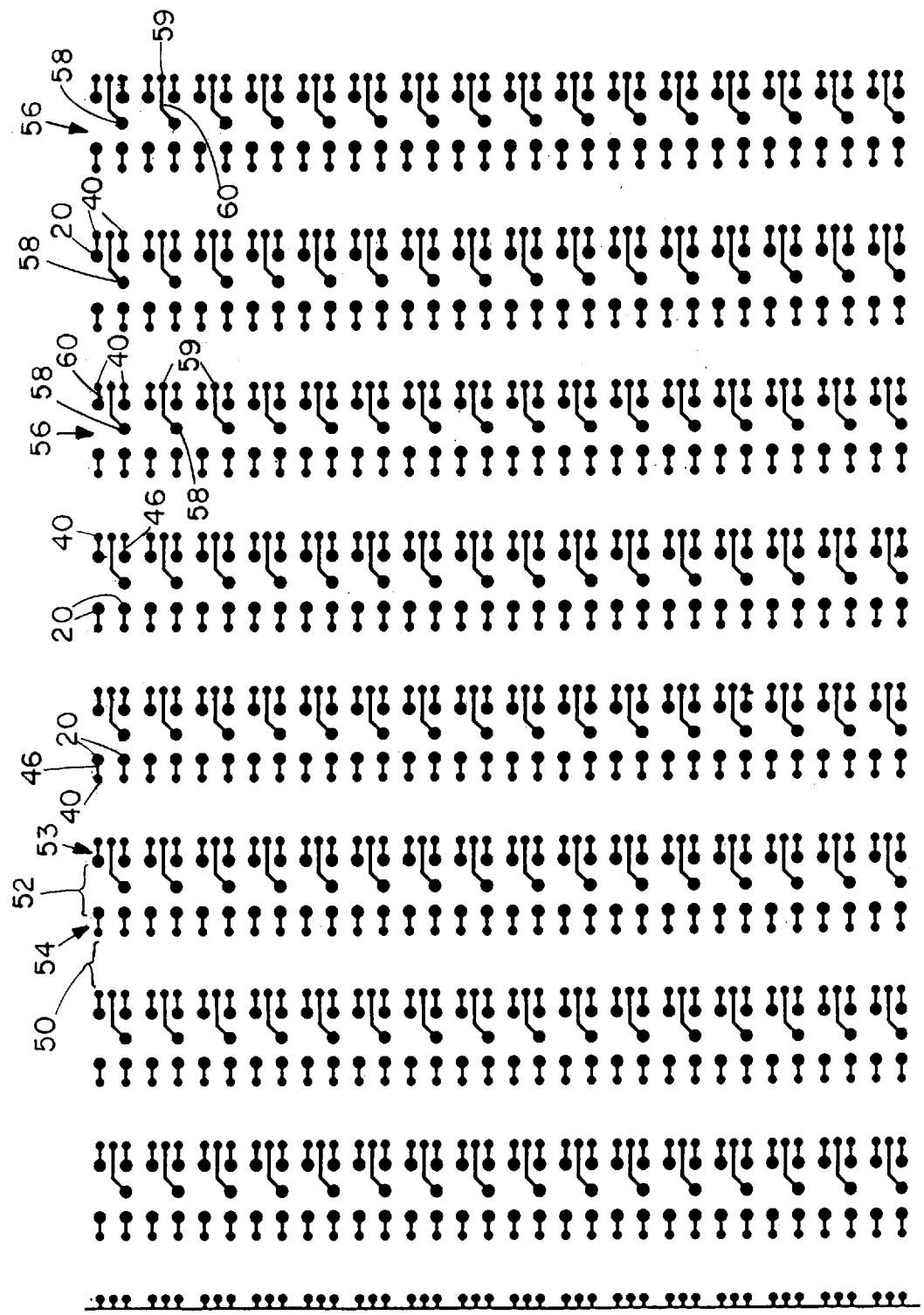
FIG. 13 is an enlarged view of part of FIG. 12.

FIG. 12 illustrates the arrangement of pads and circuits or traces on the bottom layer 22 of the board 12 for interface to the ATE probes FIG. 13 is an enlargement of part of FIG. 12 illustrating the arrangement in more detail. As illustrated in FIGS. 12 and 13, the arrangement comprises twenty connector strips 52 of pads and circuits which are spaced apart by gaps 54 which are around 0.600" wide. Each connector strip 52 comprises two vertical columns 53,54 of interface pads 20 which are separated by 0.200". Small diameter via pads 40 are placed adjacent each of the interface pads 20 in each of the columns, and are connected to the interface pads by circuit traces 46. There are preferably 32 interface pads 20 in each column. A central column 56 between the two interface pad columns 53,54 contains sixteen ground pads 58. Additional via pads 59 in the right hand column are connected to the ground pads 58 by circuit traces 60. The via pads 40 are the means by which the interface pads are connected to the inner signal layer circuits, as described above in connection with FIGS. 1 and 2. The via pads 59 are the means by which the ground pads 58 are connected to the inner ground and power layers, as described in more detail below. As illustrated in FIG. 12, the lower layer 22 also has a vertical column 80 of power terminals 82 for connection to corresponding power sources in the ATE.

Figure 14:
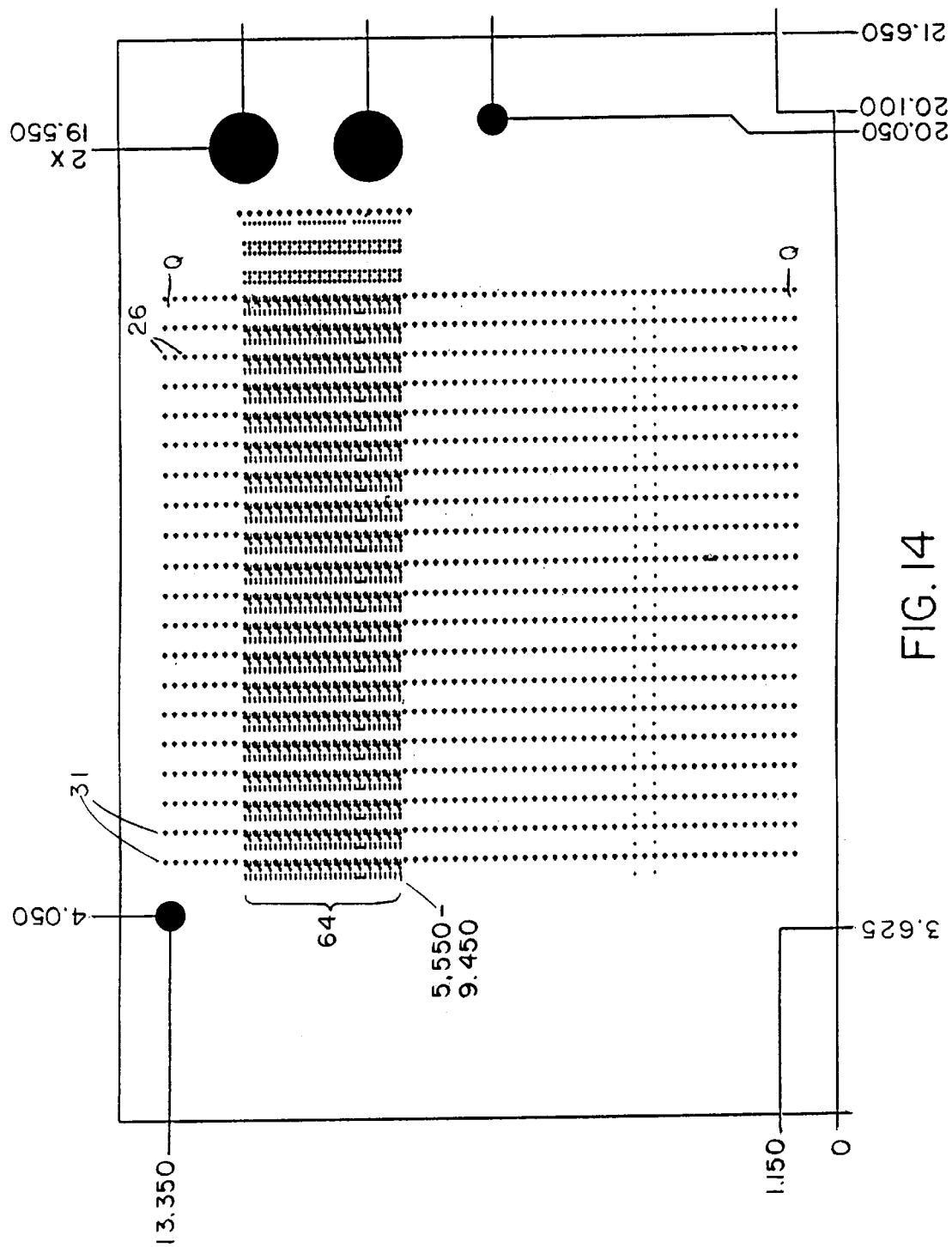
FIG. 14 is a view similar to FIG. 12 but illustrating the bottom layer pads and circuits superimposed on the grid of virtual via pads provided on the inner signal layers.

FIG. 14 illustrates the virtual via grid of FIG. 10 superimposed on the bottom layer of FIG. 12. It can be seen that each of the columns 31 of virtual via pads in the grid is aligned with one of the columns of via pads 40 and ground via pads 59, but none of the grid points 26 is aligned with either a via pad 40 or a ground via pad 59. The ground via pads 59, which will not be aligned with any of the pads 26, can be connected by through hole plating to virtual via pads in the ground and signal layers, as described in more detail below in connection with FIGS. 16 to 20.

Figure 15:
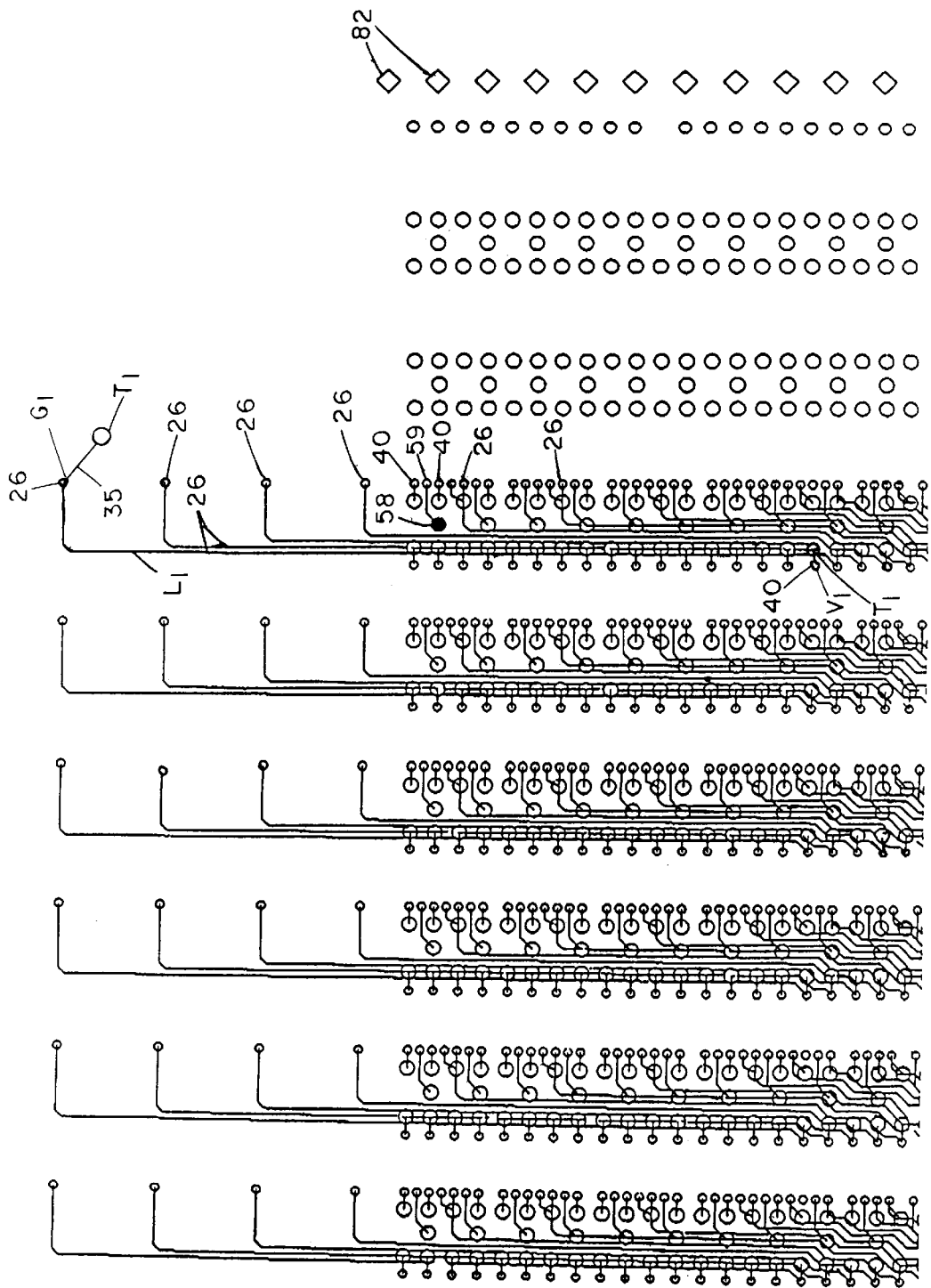
FIG. 15 is an enlargement illustrating a portion of the bottom layer pads and circuits superimposed on a portion of one of the inner signal layers to illustrate signal routing from an upper layer test pad through the inner signal layer to an interface pad on the lower layer.

FIG. 15 is an enlarged view of a portion of the board illustrating part of an inner signal layer superimposed on a corresponding portion of the lower layer of the board. One of a plurality of test pads on the upper layer, indicated as $T_1$ in FIG. 15, is shown to illustrate the connection of that test point to one of the interface pads, indicated as $I_2$, on the lower layer. As indicated, test pad $T_1$ is connected by a circuit trace 35 on the upper layer to a via pad on the upper layer aligned with a grid point or via pad, indicated as $G_1$, on the inner signal layer. One of the circuit traces 28, indicated as $L_1$ in FIG. 15, connects grid point $G_1$ with a second via pad $V_1$ on the same signal layer. The via pad $V_1$ can be connected to a via pad 40 on the lower layer by through hole plating, and this via pad is in turn connected to the interface pad $I_2$ on the lower layer by circuit trace 46.

It will be understood that test pads 16 may be positioned randomly anywhere on the upper layer, as dictated by the location of the test points 11 on the-circuit to be tested. Autorouting software may be used to assign each test pad 16 to an appropriate grid point or inner signal layer first via pad 26. If a test pad is located over or too close to a virtual via pad in the grid, that pad cannot be used and is removed from the software map used to automatically assign test pads to the closest available virtual via pad. The software also automatically removes the opposite end via from any assigned via pad. With this arrangement, there are occasionally test pads that cannot be assigned to any virtual via locations in the grid, for example when all available vias are already assigned. In this case, circuits can be routed between the top and bottom layers without using any of the intervening signal layers, using gaps 70 provided between the circuits in the signal and power/ground layers for this purpose. When all the inner signal layers and the power/ground layers are aligned and secured together, the gaps 70 between the groups of circuits on the inner signal layers will all be aligned with each other and with corresponding gaps 80 in the power/ground layers, so that there will be a series of strip-like gaps in the circuit board which have no circuits or via pads in the inner layers. These gaps are preferably of the order of 0.35" in width, and can be used for routing any test pad on the upper layer which cannot be assigned to a grid point to the corresponding interface pad on the lower layer. As illustrated in FIG. 15, a free via 72 may be deposited on the upper layer in any one of the gaps 70, and is connected by a suitable circuit to the unassigned test pad. An aligned free via is deposited on the lower layer, and the vias are connected by through hole plating. The associated ATE or interface pad 20 is then connected to the free via on the lower layer by a suitable circuit trace.

Figure 20:
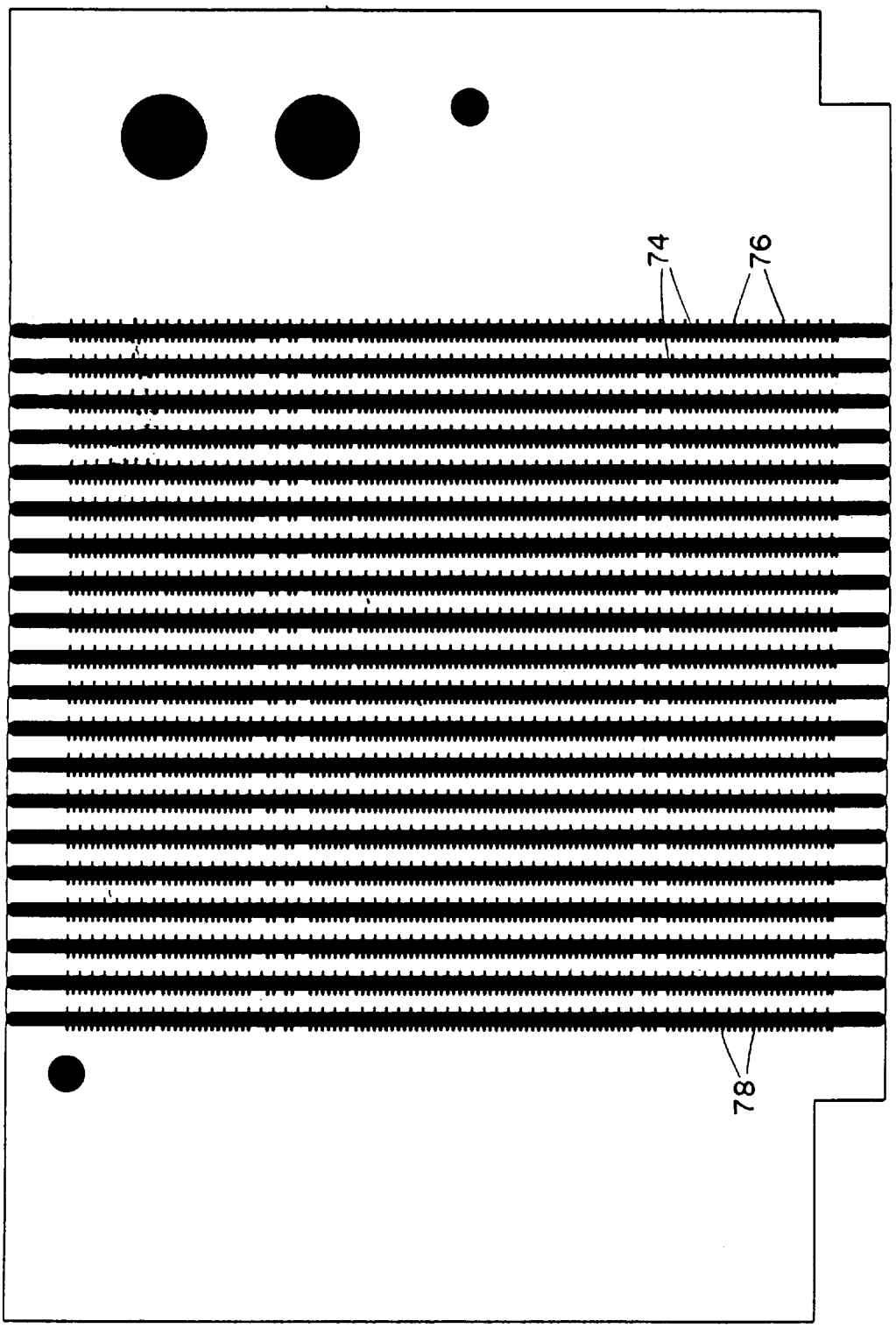
FIG. 20 is a composite plan view illustrating all of the power/ground layers of FIGS. 16 to 20 superimposed.
Figure 21:
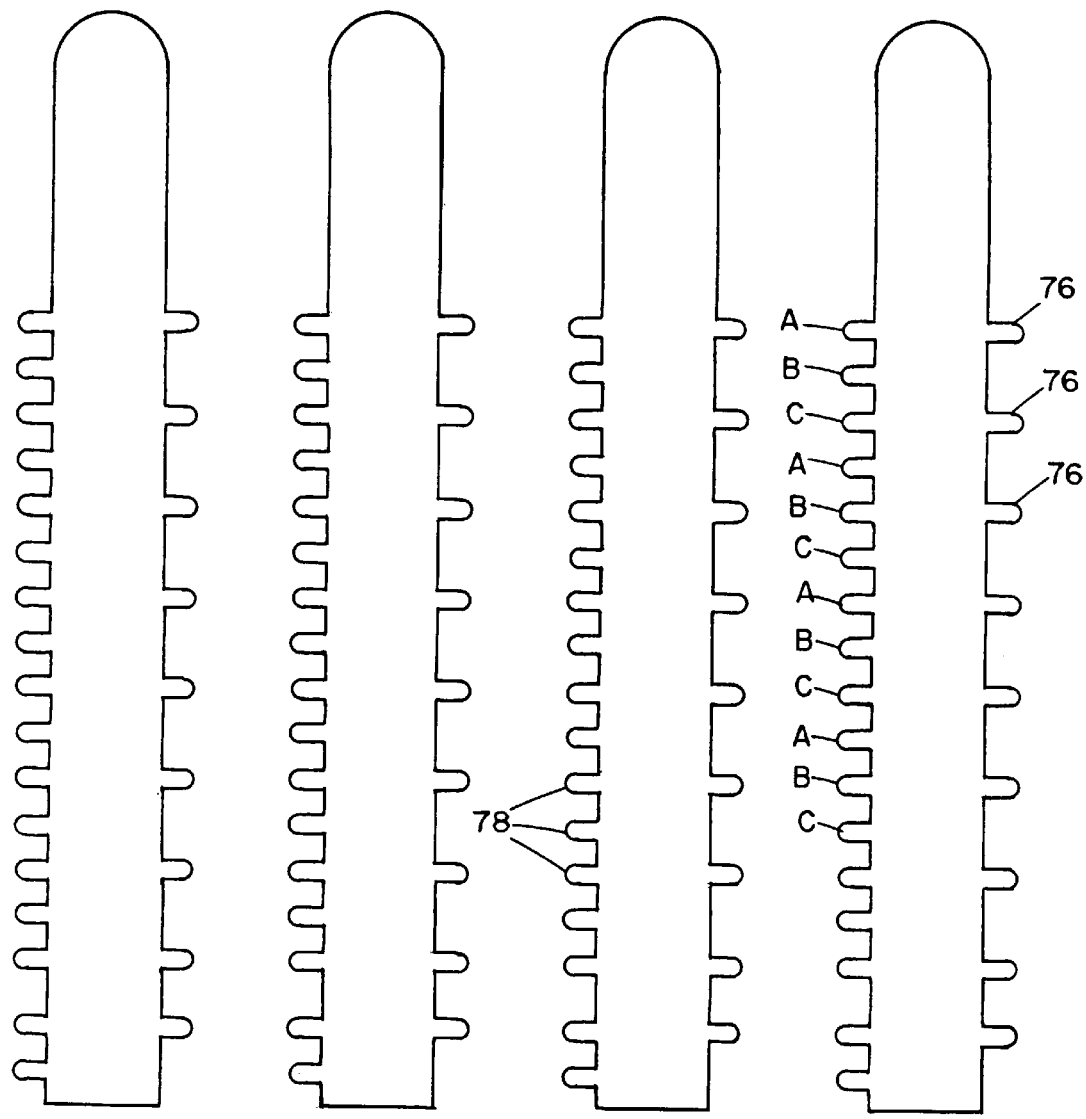
FIG. 21 is an enlarged view of a portion of FIG. 20.

The interface board, like most multi-layer printed circuit boards, includes internal power and ground layers. The interconnection of the inner layer power and ground planes with the ATE power and ground and the unit under test will now be described in more detail with reference to FIGS. 16 to 25. FIGS. 16 to 19 illustrate the four power and ground layers 25, while FIG. 20 illustrates the four layers superimposed, and FIG. 21 is an enlargement of a portion of FIG. 20.

Figure 16:
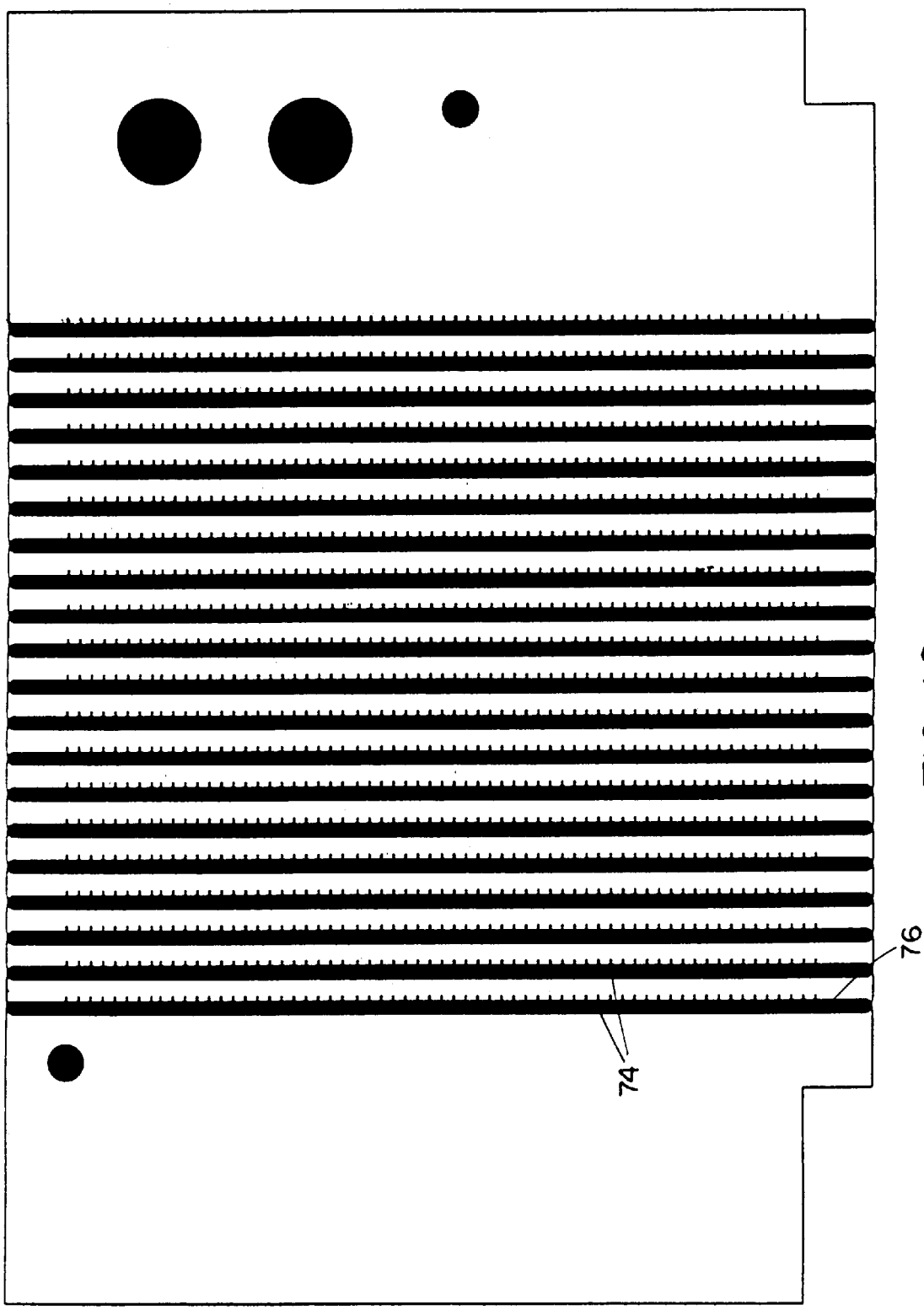
FIG. 16 is a plan view illustrating an inner power/ground layer that is dedicated to switch ground.
Figure 17:
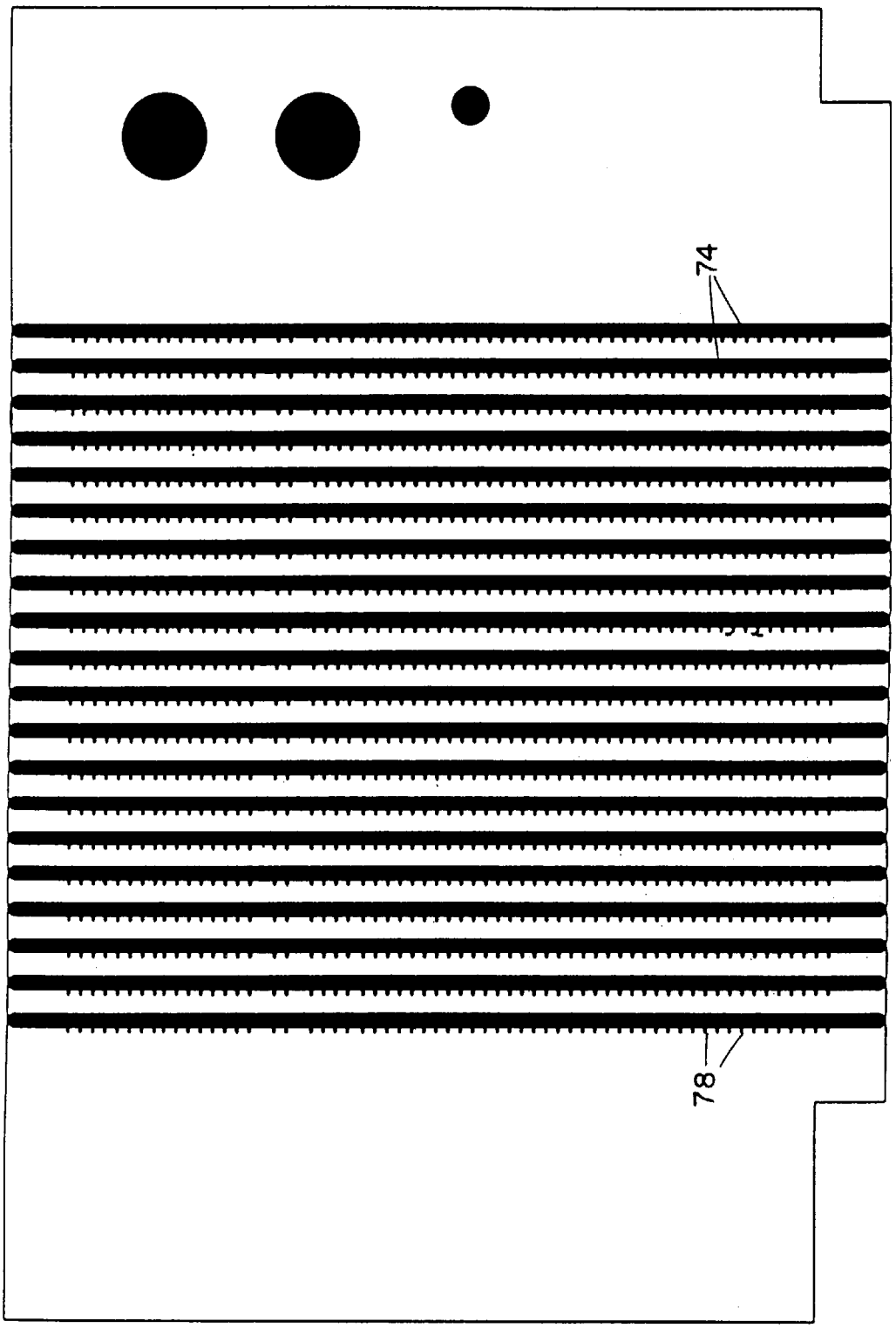
FIG. 17 is a plan view of a first general purpose power/ground layer.
Figure 18:
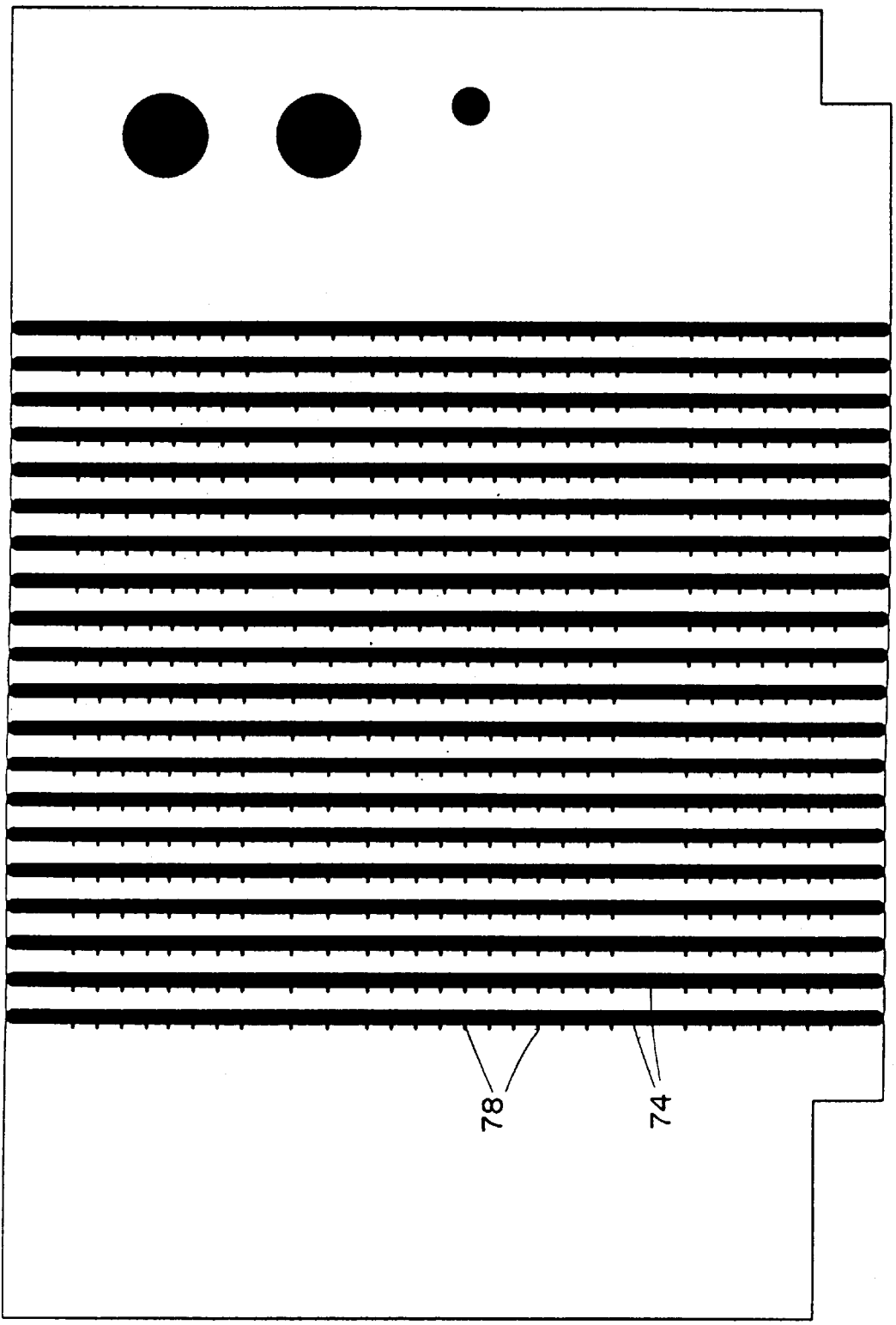
FIG. 18 is a plan view of a second general purpose power/ground layer.
Figure 19:
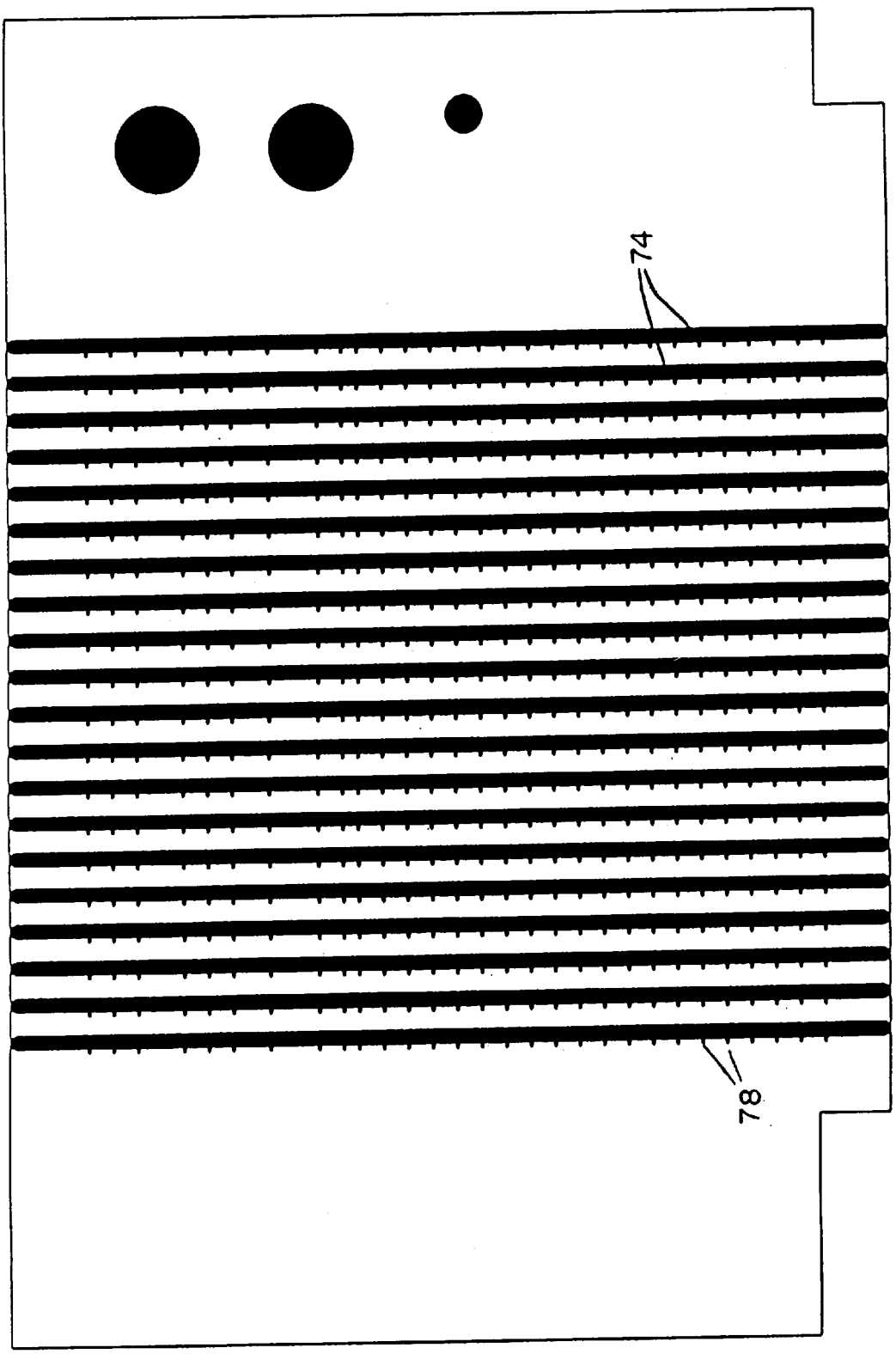
FIG. 19 is a plan view of a third general purpose power/ground layer.
Figure 25:
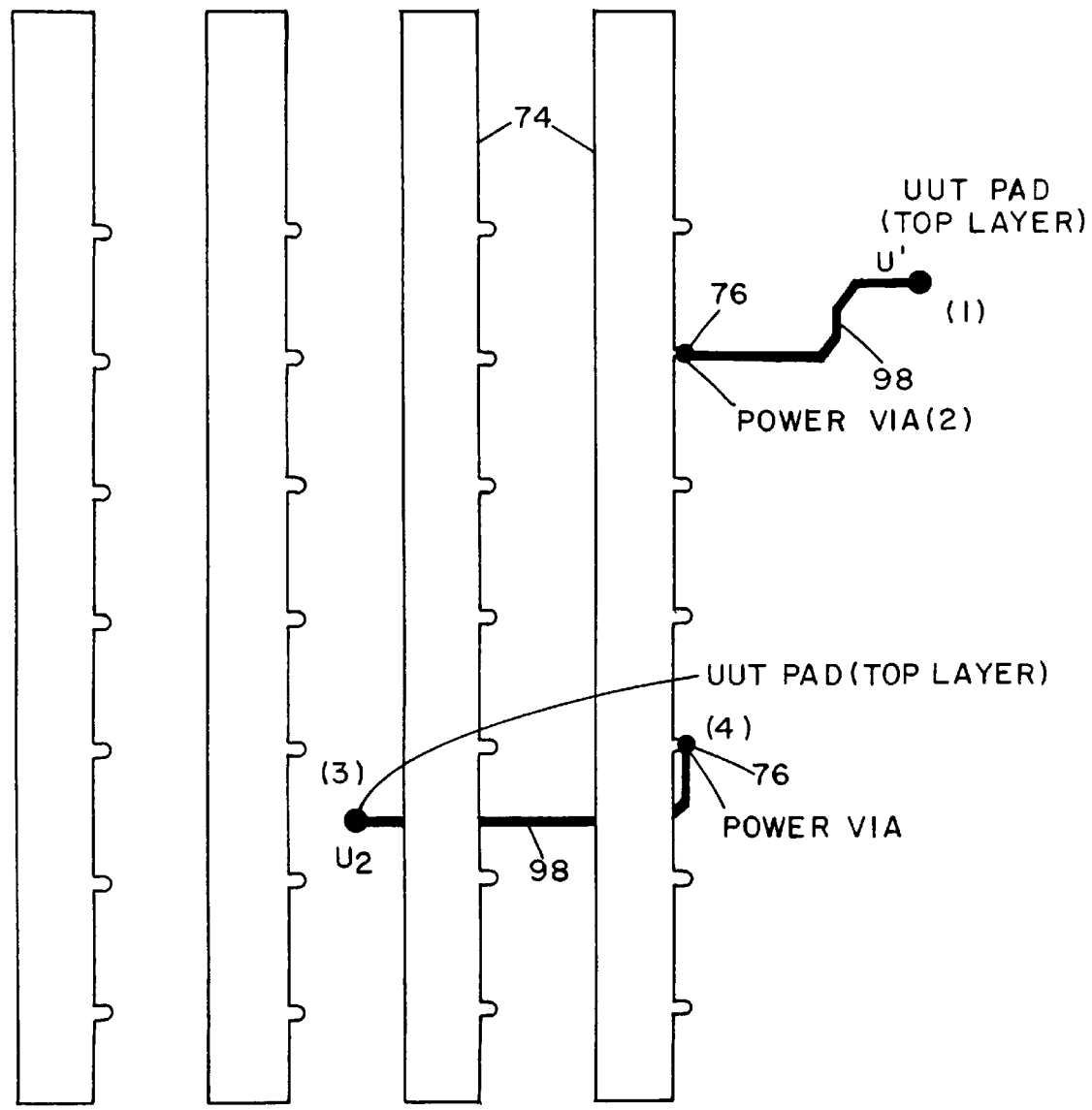
FIG. 25 is a view similar to FIG. 21 illustrating the connection of two UUT pads on the upper layer to one buss.

FIG. 16 illustrates the first power/ground layer, which is a dedicated digital ground plane, and FIGS. 17 to 20 illustrate three power/ground layers. Each of the layers has a series of twenty conductive strips or busses 74. The busses 74 in the dedicated ground plane have ground via pads 76 aligned along the right hand side of each bus, and connected to the buss by suitable conductive traces. The busses 74 in FIG. 16 will all be connected to one of the terminals 82 in the lower layer which is a dedicated ground terminal. As described in more detail below, through hole plating is used to connected the dedicated ground terminal to one of the bands 32 in a signal layer, and this band is then connected to the respective busses in the dedicated ground layer by through hole plating. The via pads 76 on the right of the busses in FIG. 16 can then be used as desired to connect any desired ground net point in the circuit under test to a ground buss 74, as illustrated in FIG. 25. Each of the power/ground layers preferably also has a copper pour 90 in the upper right hand corner, as illustrated for the first layer in FIG. 16, which is used to connect the power terminals to the bands by means of virtual vias, as explained in more detail below.

Each of the other power/ground layers has a series of via pads 78 on the left hand side of each buss. The arrangement of via pads 78 in each layer is such that when the four layers are superimposed as in FIGS. 20 and 21, none of the via pads 78 in any layer is aligned with a via pad 78 in any of the other layers.

Figure 22:
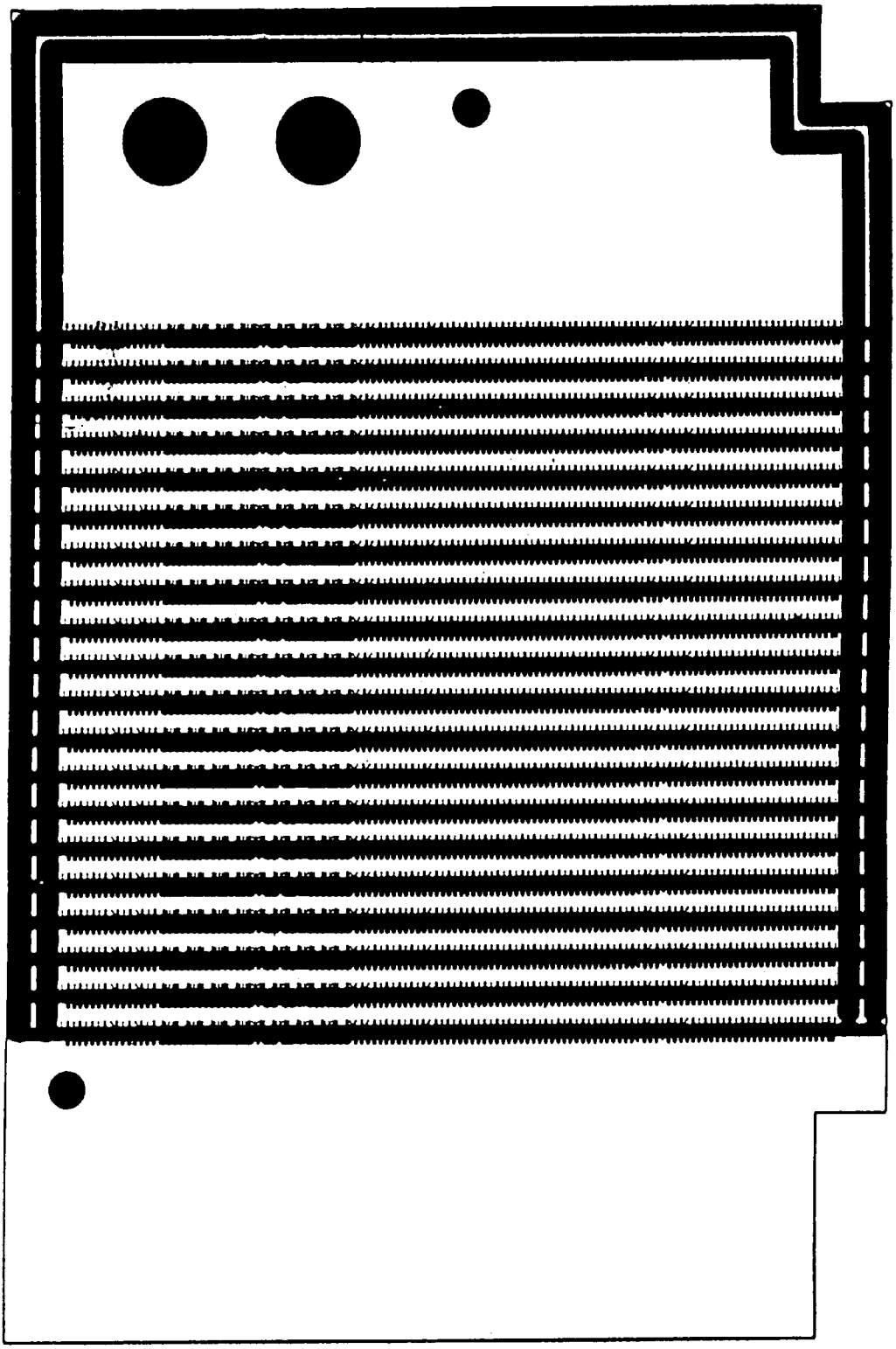
FIG. 22 is a composite view of all four power/ground layers and one of the inner signal layers.

With this arrangement, any one or a combination of the twenty busses on each of the power/ground layers can be connected to any one of the bands 32 in any one of the signal layers, as indicated in FIG. 22. The bands, in turn, can be connected to selected power supplies by through hole plating to the lower layer of the circuit board. Typically, there will be two power supply grounds (digital and analog) and four or more power sources. In a typical example, +5 Volt, –5 Volt, +15 Volt, and –15 Volt sources will be provided. Once a ground or power source connection is made to a respective buss, then that buss becomes dedicated to a particular voltage or ground, and the via pads connected to that buss can be used to connect to the test circuit power and ground nets.

The UUT grounds may be connected to the ground busses in the dedicated ground layer of FIG. 16 using the column of via pads 76 to the right of each buss, as illustrated in FIG. 25. A UUT pad $U_1$, on the top layer is connected to a via on the top layer placed in alignment with one of the power or ground vias 26 by means of conductive trace 98. A corresponding via pad is placed on the lower layer. The upper layer ground via pad can then be connected to the ground buss by through hole plating, as described above in connection with the signal layers. A second UUT ground pad $U_2$ is connected to the same buss as indicated in FIG. 25. The ATE switched grounds can be connected to the same busses in a similar manner, using other switched ground via pads. A randomly positioned pad placed on the top layer for connection with the UUT power or ground nets can be connected to the switched ground layer or any of the twenty busses on any of the layers of FIGS. 16 to 19 by simply routing a circuit to the nearest virtual via 76 or 78, placing corresponding via pads on the top and bottom layer in alignment with the selected virtual via, and then forming a plated through-hole.

As best illustrated in FIG. 21, the four superimposed power/ground layers will have their busses 74 in alignment, with all the vias 76 on the right hand side being connected to the busses 74 in the dedicated switched ground layer of FIG. 16. The vias 78 on the left hand side of the busses 74 alternate between the three power/ground layers, as indicated on the right hand buss in FIG. 21. Thus, the first via 78 in this buss, indicated by A, is connected to the first power/ground layer of FIG. 17, the second via, indicated by B, is connected to the second power/ground layer of FIG. 18, and the third via, indicated by C, is connected to the third power/ground layer of FIG. 19, and so on down the buss.

As noted above, when a UUT pad is assigned to a particular buss then that buss becomes dedicated to that UUT voltage or ground net. Thus, up to twenty different voltages or grounds can be accommodated on each of the three general purpose power/ground layers. These sixty busses can be connected to any one of the bands 32 on any signal layer. FIG. 22 illustrates the overlap between the busses 74 and the bands 32 when the power/ground and signal layers are laminated together. A connection can be made from any band to any buss by through hole plating at the overlap between the selected buss and band. Because there are four signal layers and three general purpose power/ground layers, space for up to twelve isolated via pads must be provided at the ends of each buss, to ensure isolated connection of each buss to any one of the signal layer bands.

Figure 23:
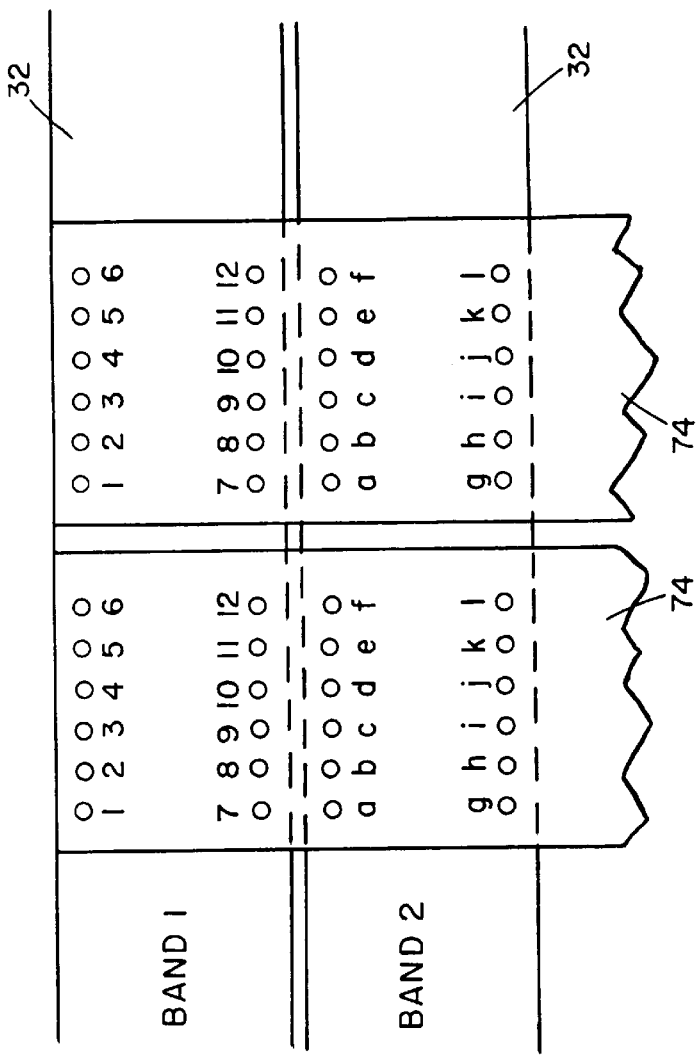
FIG. 23 is an enlarged view of a portion of FIG. 22 illustrating the overlap between two of the busses and the two signal layer bands.

FIG. 23 is a close up view of one of the intersecting areas between two busses 74 and the two signal layer bands 32. There are twelve virtual via pads or terminals 92 at each buss/band intersection, labeled 1 to 12 for Band 1 in FIG. 23, and a to l for Band 2. By placing via pads 94,95 on the top and bottom layers of the board at any of these locations, as illustrated schematically in the cross-sectional view of FIG. 24, band 1 or 2 on any of the four signal layers can be connected to any of the busses on any of the three general purpose power/ground layers of FIGS. 17 to 19. By placing bands 32 for the power/ground connection around the outside of the boards, the area in which other circuitry can be placed is maximized.

Figure 24:
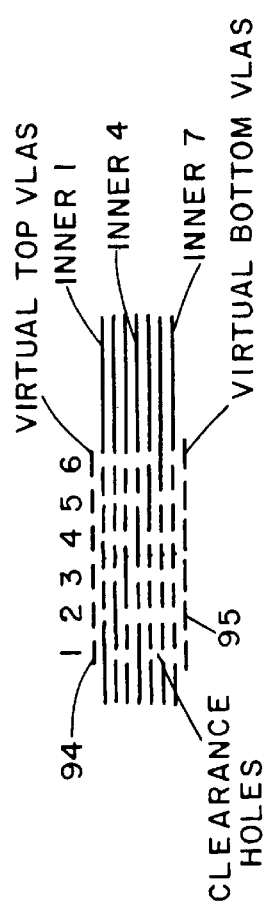
FIG. 24 is a cross-sectional view through one row of terminals at the overlap between one buss and one band to illustrate how one of the bands in one of the signal layers is connected to one of the busses in one of the power/ground layers.

FIG. 24 illustrates the interconnection technique in more detail. At the location of each specific terminal 92, each of the signal layers except one and each of the power/ground layers except one will have clearance holes 96. Clearance holes have no copper and are larger in diameter than a drilled, plated through hole. Thus, if a plated through hole is drilled through the clearance holes, there will be no connection to any of the layers having through holes. In the example of FIG. 24, all of the layers except the first signal layer (labeled INNER 1) and the fourth layer INNER 4 (a power/ground layer) have clearance holes. Thus, if a hole is drilled and through-hole plated at this location, then band 1 of inner layer 1 will be connected to buss 1 of inner layer 4. Band 1 of inner layer 1 is then connected to the designated power terminal 82 on the lower layer 22 in order to make buss 1 of inner layer 4 a particular power buss. This is done by means of a similar through hole plating technique from the band to the terminal 82 at the right hand side of the board. The copper pours on the upper right hand corners of the power/ground layers are used to connect to the bands in the signal layers by means of vias and through hole plating. There may be two or more isolated copper pours on each power and ground layer to provide the required number of different power and ground terminal connections to the bands. The copper pours can be connected to the respective power terminals in the same manner as the busses and bands, as illustrated in FIG. 24.

This invention provides a unique and innovative printed circuit board with pre-fabricated inner layers, and a method of using the board in the design and fabrication of one-of-a-kind multi-layer printed circuit boards for wireless test fixture applications. The printed circuit board forms a virtual grid panel which can be used in essentially any test fixture application, by appropriate configuration of the upper and lower layers, and drilling and through hole plating at the appropriate points in the panel.

As described above, the panels or printed circuit boards have inner layers which are all pre-configured, chemically processed, and laminated inside unfinished upper and lower layers. When a particular product is to be tested, auto router software is used to take the test point arrangement on the unit under test and compare it with the array of virtual grid points in the panel. The test points are configured into corresponding test pad positions on the upper layer, and each test pad position is assigned to the closest available virtual grid via, until all test pad assignments are made. Similar assignments are made on the bottom layer. The auto router software will produce a design of pads and circuits for the upper and lower layers, and these layers can then be processed, and the appropriate through holes can be drilled and plated to provide all the required test point connections to the ATE, as well as the required power and ground connections.

This technique is considerably faster, more efficient, and less expensive than previous test fixture design procedures. In previous wireless test fixture design, a completely new multi-layer circuit board had to be designed from scratch for each new unit to be tested. This meant that each layer had to be appropriately configured, and the multiple layers then laminated and interconnected to provide the desired through board connections. This sometimes involved design of ten or more separate circuit board layers. In contrast, in the present invention, all inner layers are pre-fabricated and only the outer two layers have to be configured for a specific installation. Because about 90% of the circuitry is already provided in the pre-fabricated inner layers, the time taken to design and auto-route the virtual grid panel of this invention for a particular test fixture is only a few minutes, as compared to many hours or even days for prior art installations.

Although a preferred embodiment of the present invention has been described above by way of example only, it will be understood by those skilled in the field that modifications may be made to the disclosed embodiment without departing from the scope of the present invention, which is defined by the appended claims.

I claim:

1. A method of connecting a unit under test having a plurality of test points to automated test equipment, comprising the steps of:

providing a multi-layer printed circuit board for providing interconnections between test points on the unit under test and pre-selected terminals of automated test equipment, the printed circuit board having a plurality of stacked, pre-fabricated inner signal layers, each signal layer having a predetermined arrangement of spaced circuits each having a first via pad at one end and a second via pad at the opposite end, the first via pads forming a virtual grid of vias for selective connection to test points of a unit under test, and first and second outer layers secured at opposite ends of the stack of internal layers;

selecting the closest available via pad in the virtual grid to each test point in a unit under test and assigning the selected via pad to the respective test point;

processing the first outer layer to provide a test pad aligned with each test point on the unit under test, a via pad for each test pad which is aligned with the assigned via pad in the virtual grid for the respective test point, and a connecting trace between each test pad and the associated via pad;

drilling a plated through hole through the board at each outer layer contact pad to connect the outer layer via pad with the aligned virtual grid via, whereby at least a plurality of test pads is connected to predetermined virtual grid vias; and processing the second outer layer to provide a via pad aligned with each second via pad at the opposite end of each conductive trace connected to an assigned virtual grid via, drilling a plated through hole through each outer layer via pad to connect the second outer layer via pads with respective second via pads, providing a series of interface contact pads on the outer layer for connection to respective automated test equipment terminals, and connecting each interface contact pad with a respective second outer layer via pad with a conductive trace.

2. The method as claimed in claim 1, wherein the step of assigning each test point to the closest available virtual grid via includes determining whether any test points are unassignable to a virtual grid via, placing free via pads on the first outer layer in alignment with gaps between the circuits in the signal layers, connecting each unassignable test pad to a selected free via pad, placing a free via pad on the second outer layer in alignment with each free via pad on the first outer layer, and connecting the aligned free via pads on the first and second outer layers together by through hole plating.

3. The method as claimed in claim 1, including the steps of stacking a plurality of power and ground layers with the signal layers, each power and ground layer having a plurality of spaced, parallel conductive busses aligned with the busses in the other layers and a plurality of power and ground vias connected to each buss, providing power terminals on the second outer layer for connection to power sources in automated test equipment, connecting each power terminal to at least one of the busses, placing power and ground via pads on the first outer layer for providing power and ground connection to the unit under test, and connecting the power and ground via pads to selected power and ground vias on the power and ground layers by through hole plating.

4. The method as claimed in claim 3, wherein each inner signal layer is pre-fabricated to provide at least one conductive band around at least part of the periphery of the inner signal layer, the conductive band extending over the ends of the busses in the power and ground layers, and the step of connecting each power terminal to one of the busses comprises connecting each buss to a respective band by through hole plating, and connecting the bands to respective terminals in the second outer layer.

\* \* \* \* \*